United States Patent
Tsuchiaki

(10) Patent No.: US 7,678,652 B2
(45) Date of Patent: Mar. 16, 2010

(54) MOSFET-TYPE SEMICONDUCTOR DEVICE, AND METHOD OF MANUFACTURING THE SAME

(75) Inventor: Masakatsu Tsuchiaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 12/222,146

(22) Filed: Aug. 4, 2008

(65) Prior Publication Data
US 2008/0299719 A1 Dec. 4, 2008

Related U.S. Application Data

(62) Division of application No. 11/205,025, filed on Aug. 17, 2005, now Pat. No. 7,420,230.

(30) Foreign Application Priority Data

Feb. 4, 2005 (JP) ............... 2005-028963

(51) Int. Cl.
*H01L 21/336* (2006.01)
(52) U.S. Cl. ............... 438/268; 438/283; 257/E21.375; 257/E21.41; 257/E21.629
(58) Field of Classification Search .................. 438/156, 438/157, 173, 176, 268, 283; 257/220, 302, 257/E21.375, E21.41, E21.439, E21.629
See application file for complete search history.

(56) References Cited

U.S. PATENT DOCUMENTS

| 6,051,509 | A | 4/2000 | Tsuchiaki |
| 6,271,566 | B1 | 8/2001 | Tsuchiaki |
| 6,545,327 | B2 | 4/2003 | Tsuchiaki |
| 7,148,541 | B2 * | 12/2006 | Park et al. ............ 257/347 |

OTHER PUBLICATIONS

Huang et al., "Sub-50 nm P-Channel FinFET", IEEE ED, vol. 48, No. 5, pp. 880-886, (2001).

* cited by examiner

*Primary Examiner*—Quoc D Hoang
(74) *Attorney, Agent, or Firm*—Finnegan, Henderson, Farabow, Garrett & Dunner, L.L.P.

(57) ABSTRACT

A MOSFET-type semiconductor device includes a monocrystalline semiconductor layer formed in a shape of a thin wall on a insulating film, a gate electrode straddling over the semiconductor layer around the middle portion of the wall-shaped semiconductor layer via a gate insulating film, source and drain regions formed at the both ends of the semiconductor layer, a first metal-semiconductor compound layer formed on one of the side walls of each of source and drain regions of the semiconductor layer, and a second metal-semiconductor compound layer having a different composition and Schottky barrier height from that of the first metal-semiconductor compound layer on the other side wall of each of source and drain regions of the semiconductor layer.

14 Claims, 11 Drawing Sheets

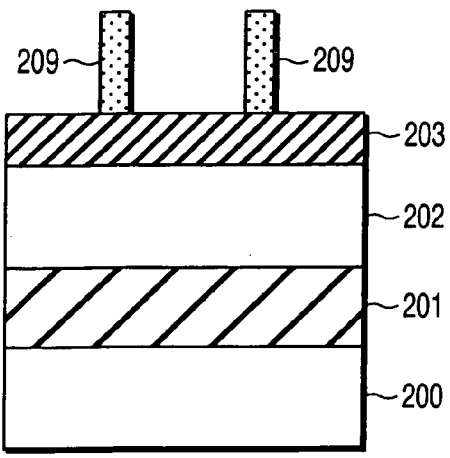
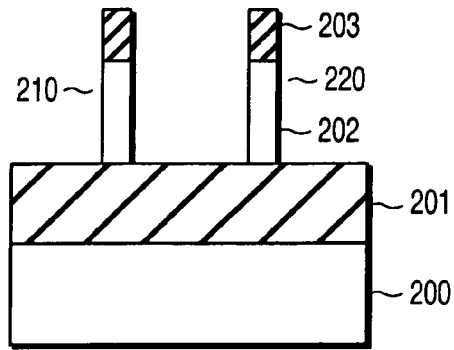
F I G. 5A  F I G. 5B
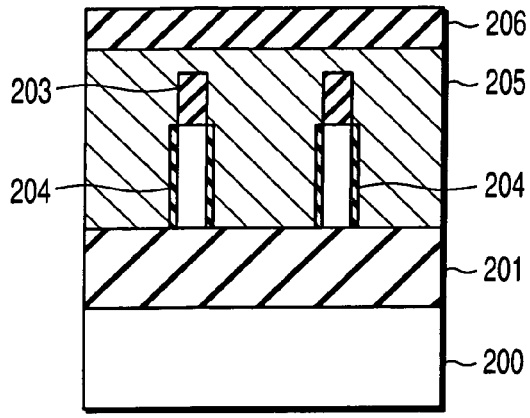
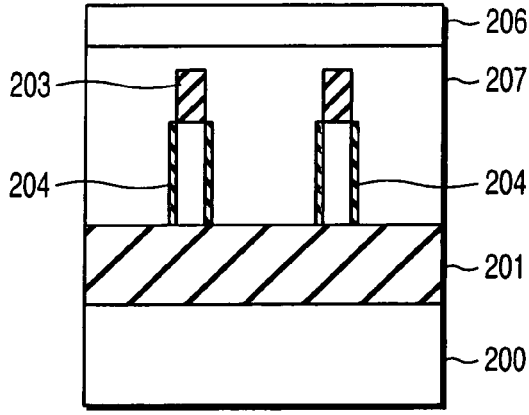
F I G. 5C  F I G. 5D
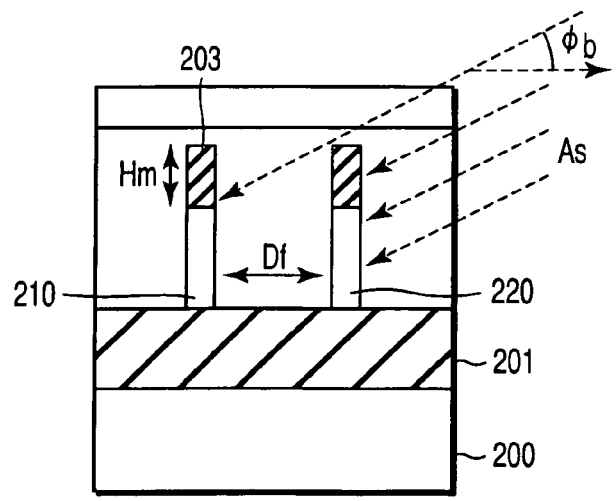
F I G. 5E

MOSFET-TYPE SEMICONDUCTOR DEVICE, AND METHOD OF MANUFACTURING THE SAME

CROSS-REFERENCE TO RELATED APPLICATIONS

This application is a divisional of U.S. patent application Ser. No. 11/205,025, filed on Aug. 17, 2005 now U.S. Pat. No. 7,420,230, which is based upon and claims the benefit of priority from prior Japanese Patent Application No. 2005-028963, filed Feb. 4, 2005. The entire contents of these related applications are incorporated herein by reference.

BACKGROUND OF THE INVENTION

1. Field of the Invention

The present invention relates to a MOS-type semiconductor device in which MOSFET is formed on a semiconductor layer provided in a thin wall-like fashion on an insulating film. More specifically, the present invention relates to a field effect transistor with a thin wall-shaped semiconductor body and double gates on both sides of the wall-shaped body (to be abbreviated as Fin-MOSFET hereinafter), and a method of manufacturing the transistor.

2. Description of the Related Art

Recently, Fin-MOSFET is attracting much attention, in which a silicon layer on the SOI wafer is vertically processed into a thin wall-like plate shape (i.e., fin-shape) as a body (i.e., channel region) of a MOSFET to be formed on an insulating layer. (See X. Huang et al., IEEE ED vol. 48, p 880 (2001)).

In the case where a body of an elemental device (i.e., transistor) is made of an extremely thin silicon layer such as in a Fin-MOSFET, to secure fast operation of the device, it is essential to reduce the electrical resistance of the source-drain regions which are to be formed around the opposing ends of the thin-body. In order to achieve this, there is proposed, for example, a method of forming layers of a metallic compound (i.e., silicide) by making a part of the source-drain regions react with a metallic substance. However, to take a full advantage of the silicide formation (i.e., silicidation), it is also necessary to reduce the contact resistance emerging at the interface between silicon and metallic silicide to a sufficiently low level, otherwise, the current flow into the silicide layers will be impeded at the interface, nullifying the reduction of the sheet resistance by the silicidation and thus impairing the fast device operation.

The contact resistance created at the interface between silicon and metallic silicide is a result of the Schottky barrier formed between them. It is a basic property of the Schottky barrier that, for one specific silicide, the sum of the Schottky barrier $\phi n$ for electrons and the Schottky barrier $\phi p$ for holes is always equal to the band gap Eg=1.1 eV (in the case of Si). Consequently, in the manufacture of a CMOS circuit, when it is designed to reduce the contact resistance for a transistor of one polarity (say, n-MOSFET), the Schottky barrier for a transistor of the opposite polarity (i.e., p-MOSFET) inevitably increases.

In the case of CMOS circuits, once the contact resistance of a transistor of either one of the polarities is increased and its operation is slowed down, the whole signal processing is hindered because the speed of the entire circuit is limited by the operation of the slower transistor, no matter how fast is the operation of the transistor of the opposite polarity. Under these circumstances, it is imperative to chose, as the siliciding material, a material that has similar $\phi n$ and $\phi p$ values. As a result, a Schottky barrier at a level of substantially a half of that of Eg is utilized for MOSFETs of both polarities.

It should be noted here that the contact resistance depends precipitously on the Schottky barrier height. For example in the case where a silicide layer is formed in a high-concentration diffusion layer having an impurity concentration of about $10^{20}$ cm$^{-3}$, if the Schottky barrier height is decreased by 0.1 eV, the contact resistance is reduced nearly by one order of magnitude. For this reason, the Schottky barrier heights of about 0.5 eV, that are compulsively employed for both n and p polarities, is a great obstacle to the reduction of the contact resistance of a CMOS circuit to achieve a high-speed operation.

As described above, to take a full advantage of the fast device operation made possible by the Fin-MOSFET with the silicide layers on the source drain regions, it is necessary to reduce the contact resistance between the semiconductor layer that gives rise to source-drain regions and the silicide layer. However, in the manufacture of CMOS circuits, when it is designed to reduce the contact resistance for either one of the polarity, the Schottky barrier height of the opposite polarity inevitably increases, resulting in the increase in the contact resistance.

BRIEF SUMMARY OF THE INVENTION

According to an aspect of the present invention, there is provided a MOS-type semiconductor device comprising:

a monocrystalline semiconductor layer formed in a shape of a wall on an insulating film;

a gate electrode insulatively disposed over each of both side wall surfaces of the semiconductor layer;

source and drain regions formed on the semiconductor layer;

a first metal-semiconductor compound layer formed on one of the side wall surfaces of the semiconductor layer, to form a Schottky junction between the first metal-semiconductor compound layer and each of the source and drain regions; and a second metal-semiconductor compound layer having a different composition from that of the first metal-semiconductor compound layer and formed on the other side of the side wall surfaces of the semiconductor layer, to form a Schottky junction between the second metal-semiconductor compound layer and each of the source and drain regions.

According to another aspect of the present invention, there is provided MOS-type semiconductor devices comprising:

a plurality of first monocrystalline semiconductor layers each formed in a shape of a wall on an insulating film, and arranged to be in parallel with each other at intervals of a first distance;

a plurality of second monocrystalline semiconductor layers each formed in a shape of a wall on the insulating film, and arranged to be in parallel with each other at intervals of a second distance which is longer than the first distance, and to be in parallel to the first monocrystalline semiconductor layers;

a gate electrode insulatively disposed over each of both side wall surfaces of each of the first and second monocrystalline semiconductor layers;

source and drain regions formed on each of the first and second monocrystalline semiconductor layers;

a first metal-semiconductor compound layer formed on each of the side wall surfaces of the first monocrystalline semiconductor layers, to form a Schottky junction between the first metal-semiconductor compound layer and each of the source and drain regions of the first monocrystalline semiconductor layers; and a second metal-semiconductor compound layer having a different composition from that of the first metal-semiconductor compound layer and formed on each of the side wall surfaces of the second monocrystalline semiconductor layers, to form a Schottky junction between the second metal-semiconductor compound layer and the source and drain regions of the second monocrystalline semiconductor layers.

According to a still another aspect of the present invention, there is provided MOS-type semiconductor devices comprising:

a first monocrystalline semiconductor layer formed in a shape of a wall on an insulating film;

a second monocrystalline semiconductor layer formed in a shape of a wall on the insulating film, and arranged in a direction different from that of the first monocrystalline semiconductor layer;

a gate electrode insulatively disposed over each of both side wall surfaces of each of the first and second monocrystalline semiconductor layers;

source and drain regions formed on each of the first monocrystalline semiconductor layer and the second monocrystalline semiconductor layer;

a first metal-semiconductor compound layer formed on each of the side wall surfaces of the first monocrystalline semiconductor layer, to form a Schottky junction between the first metal-semiconductor compound layer and each of the source and drain regions formed on the first monocrystalline semiconductor layer; and a second metal-semiconductor compound layer having a different composition from that of the first metal-semiconductor compound layer and formed on each of the side wall surfaces of the second monocrystalline semiconductor layer, to form a Schottky junction between the second metal-semiconductor compound layer and each of the source and drain regions formed on the second monocrystalline semiconductor layer.

DETAILED DESCRIPTION OF THE INVENTION

Figure 1:
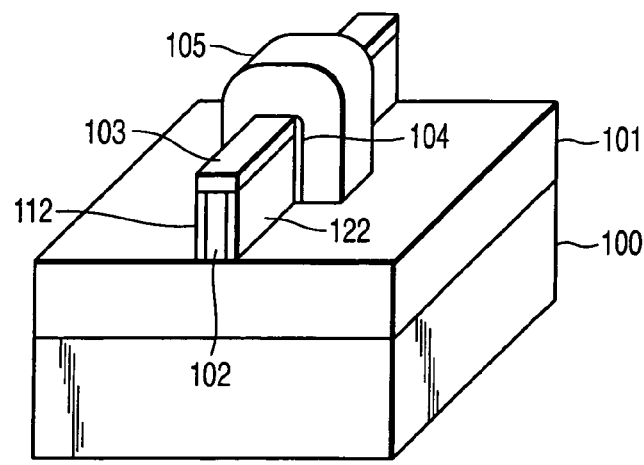
FIG. 1 is a perspective view showing a schematic structure of a Fin-MOSFET according to the first embodiment.

In order to avoid the above-described drawbacks of the conventional technique, it is advantageous to prepare different types of silicide materials for n-channel MOSFET and p-channel MOSFET, independently.

For example, it suffices if an Er silicide having a n value of small as 0.28 eV is used for the n-channel MOSFET (in which electrons flow in the channel), and an Pt silicide having a $\phi p$ value of small as 0.20 eV is used for the p-channel MOSFET (in which holes flow in the channel).

When these materials are employed for respective types of MOSFET, the multiplicative product of the values of the contact resistances to both polarities is reduced by nearly six orders of magnitude as compared to the product obtained in the case where only one type of silicide material is used for both polarities. This is because the sum of the Schottky barriers for both polarities is reduced by 0.62 eV (=1.1 eV-0.20 eV-0.28 eV) when above two different silicides are used for respective polarities, as compared to the sum of the Schottky barriers in the case where only one type of silicide material is used (i.e., 1.1 eV).

However, it is practically very difficult to form different types of silicides on n-channel MOSFET and p-channel MOSFET separately. For independent silicidation of n-MOSFET from p-MOSFET, for example, while forming a silicide (first silicide layer) in the n-channel MOSFET, the p-channel MOSFET must be covered with a heat-resisting insulating material so that it is protected from the formation of the first silicide layer during the silicidation of the n-MOSFET. On the other hand, while forming a silicide (second silicide layer) in the p-channel MOSFET, the n-channel MOSFET must be covered with a heat-resisting insulating material so that it is protected from the formation of the second silicide layer during the silicidation of the p-MOSFET. It ensues that, each of the insulating materials must be selectively applied to the specific type of the MOSFET with lithography to cover the targeted regions only.

Moreover, when forming the second silicide layer after forming the first silicide layer, the first insulating material, which served as a mask against the formation of the first silicide layer, must be removed selectively while retaining the first silicide layer intact. Furthermore, the second insulating material, as a mask against the second silicidation, must be formed at a low temperature so that the film formation does not thermally damage the first silicide layer. For a low temperature film formation, however, it is difficult to obtain an even and uniform film. Additionally, application of independent silicide layers on both polarities of the MOSFET with the aid of lithography becomes even more difficult when it is applied to a circuit rich in surface topography, such as CMOS circuit made of Fin-MOSFET's, where a plurality of steep thin-wall-shaped silicon layers, closely positioned with each other, protrudes over the main substrate. For a such circuit, it requires an extremely strict process control to be able to form different types of silicide materials independently for both polarities of MOSFET using lithography. Now it is clear that the separate formation of different types of silicide layers on the same substrate requires a number of processing steps, thereby causing an increase in the production cost.

As described above, in order to control the short channel effect by the Fin-MOSFET structure and further to form an ultrahigh-speed MOSFET by utilizing the increase in channel mobility, it is effective to form different types of silicide materials separately in the n-channel MOSFET and p-channel MOSFET in their source-drain regions, respectively. However, the separate formation of different types of silicide materials in the n-channel MOSFET and p-channel MOSFET entails such a drawback of extremely complicating the manufacturing process.

It should be noted here that the above-described drawback is not limited to the case where silicon is used as a monocrystalline semiconductor layer, but is also the case in where germanium or some other semiconductor material is used in place of silicon.

The features of the embodiments provided below are that metal-semiconductor compound layers of different materials can be formed separately in the source-drain regions of the n-channel MOSFET and p-channel MOSFET, respectively, and thus the increase in the production cost is avoided while enjoying a high-speed, which is achieved by the Fin-MOSFET structure.

Embodiments of the present invention will now be described with reference to accompanying drawings.

First Embodiment

Figure 2:
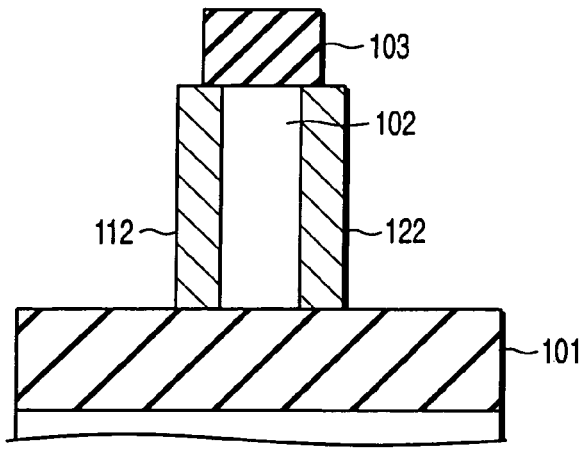
FIG. 2 is a cross sectional view showing the structure of the source-drain sections of the Fin-MOSFET shown in FIG. 1.
Figure 3:
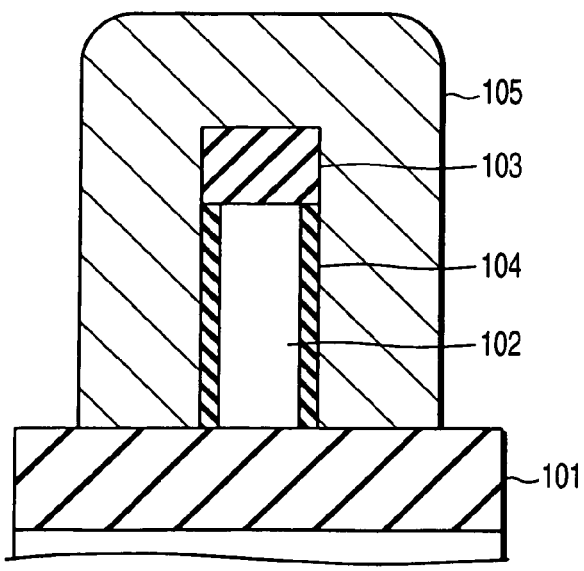
FIG. 3 is a cross sectional view showing the structure of the gate section of the Fin-MOSFET shown in FIG. 1.

FIG. 1 is a perspective view showing a brief structure of a Fin-MOSFET according to the first embodiment of the present invention. FIG. 2 is a cross sectional view showing the structure of the source-drain sections of the Fin-MOSFET shown in FIG. 1, and FIG. 3 is a cross sectional view showing the structure of the gate section of the Fin-MOSFET shown in FIG. 1.

As shown, an insulating film 101 made of an oxide film or the like is formed on a monocrystalline silicon substrate 100, and a thin-plate fin-shaped silicon layer (monocrystalline semiconductor layer) 102 is vertically formed thereon. An insulating film 103 is formed on the silicon layer 102. A gate electrode 105 is formed over a gate insulating film 104 on each of the side surfaces of the silicon layer 102. The gate electrode 105 is also formed on the upper surface of the insulating film 103 and thus straddles over the silicon layer between the side surfaces of the silicon layer 102.

Impurities are introduced to both sections of the silicon layer 102, divided by the gate electrode 105 therebetween, to form a source region and a drain region (source-drain regions). A first silicide layer 112 is formed on one side of the side wall surfaces of the silicon layer 102 on which the source-drain regions are formed, and a second silicide layer 122 is formed on the other side of the side wall surfaces.

Next, the method of manufacturing a Fin-MOSFET according to this embodiment will now be described with reference to FIGS. 4A to 4F.

Figure 4A:
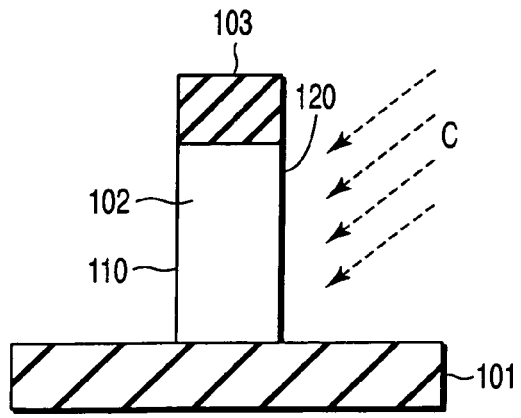
FIGS. 4A to 4F are cross sectional diagrams designed to illustrate processing steps of the manufacture of the Fin-MOSFET according to the first embodiment.

FIG. 4A shows a schematic cross-section of a fin-shaped silicon layer 102 in formed on the insulating film 101 of the silicon substrate 100. The insulating film 103 that was used as an etching mask during formation of the fin-shaped silicon layer 102 remains on the silicon layer 102. It should be understood that, at this stage, the gate electrode (not shown in this cross-section) is already formed over the silicon layer at a different section.

Then, carbon (C) atoms are implanted obliquely to the silicon layer 102 where the source-drain regions are to be formed. As a result of this sideway C impingement, C atoms are introduced to only one of the surfaces, that is surface 120 of the source-drain region.

Figure 4B:
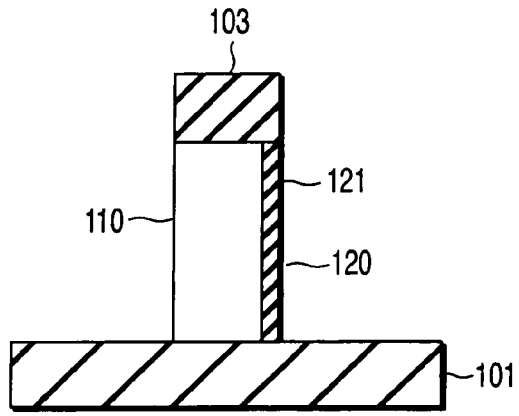

Next, the silicon layer 102 is oxidized and dipped into a dilute HF solution of 200:1 concentration. Thermal oxidation of the carbon-containing silicon layer results in formation of a HF-resistant oxide film. Once the resulting HF-resistant oxide film is immersed in a HF solution, the etching of the film virtually stops when the remaining film thickness decreases down to 1-2 nm. (See, for example, U.S. Pat. No. 6,051,509) For this reason, as shown in FIG. 4B, about 1 nm-thick HF-resisting oxide film (as a side wall protection insulating film) 121 remains only on one side of the side walls, that is, the surface 120 of the source-drain regions, whereas silicon is exposed on the other side wall surface 110 of the source-drain regions.

It should be added here that it is very important to have a thin film with an excellent HF-resistance. It has been proved experimentally that, for example, a silicon nitride film as thin as 1 to 2 nm, formed by a CVD (chemical vapor deposition) method, cannot withstand etching by HF solution. However, the HF treatment is an essential pre-treatment for achieving a good silicidation, by removing a native oxide. Thus, it is imperative for a thin silicide-masking film to have an excellent HF resistance.

Figure 4C:
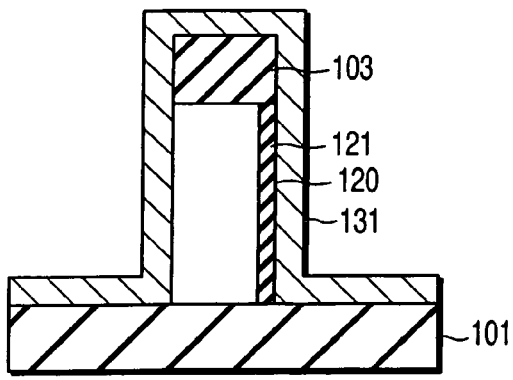

Next, as shown in FIG. 4C, a first metal film 131 made of, for example, Pt is formed by sputter-deposition on an entire surface of the substrate. Then, the resultant structure is subjected to a heat process, and thus the silicidation reaction proceeds in a side wall surface 110, where silicon is exposed. On the other hand, the HF-resisting oxide film 110 serves as a mask, and therefore the silicidation reaction is prevented on the opposite side of the silicon layer 120.

Figure 4D:
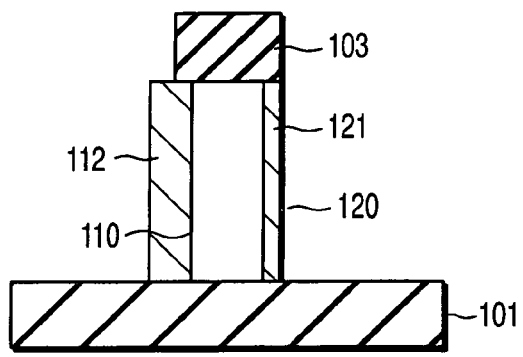

Consequently, after removal of un-reacted metal, as shown in FIG. 4D, a first silicide layer 112 is formed only on the side wall surface 110.

Figure 4E:
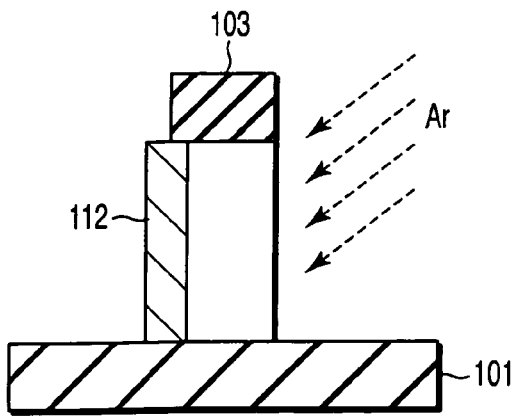

Subsequently, as shown in FIG. 4E, energetic particles with a sputter-etching ability, for example, Ar, are applied at an oblique angle to the resultant structure. In this manner, the very thin HF-resisting oxide film 121 can be readily removed without particle impingement on the first silicide layer 112. It should be noted that the HF-resisting oxide film 121 is thin as 1 to 2 nm and therefore it can be easily removed.

Figure 4F:
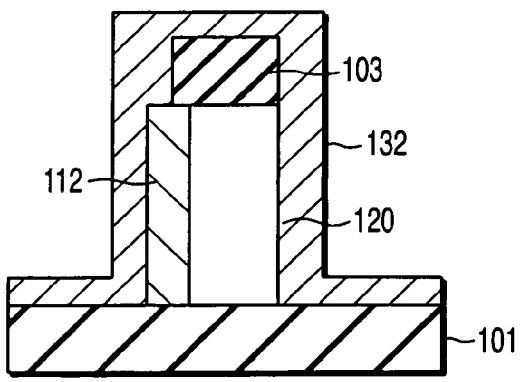

After that, as shown in FIG. 4F, a second metal film 132 made of, for example, Er is formed by sputter-deposition on an entire surface of the substrate. Then, the resultant structure is subjected to a heat process, and thus the silicidation reaction proceeds in a side wall surface 120, where silicon is exposed. On the other hand, the first silicide layer 112 serves as a mask, and therefore the silicidation does not proceed in the side wall surface 110.

Consequently, as shown in FIG. 2, a second silicide layer 122 is formed only on the side wall surface 120.

As described above, in this embodiment, tilted implantation of carbon (C) atoms enabled selective formation of the silicidation mask (i.e., the HF-resistant oxide) only on one side of the fin-shaped silicon layer for the fabrication of the Fin-MOSFET. As a result, the first silicide layer 112 is formed on the other side wall surface, that is, the side wall surface 110, without requiring the lithography over steep topography. Further, the etching particles are applied at an oblique angle, and thus the HF-resisting oxide film 121 can be removed without adversely affecting the first silicide layer 112. Therefore, the second silicide layer 112 is formed on the side wall surface 120 without requiring the lithography process carried out to the sharp Fin structure that rises straight up over the substrate.

In addition, the first silicide layer 112 having a small $\phi$p and the second silicide layer 122 having a small $\phi$p can be formed independently on the side surfaces 110 and 120 of the source-drain regions of the Fin-MOSFET, respectively. With this structure, irrespective of the polarities of the MOSFET, either one of the silicide layers always provides a small Schottky barrier. Therefore, substantial reduction of the contact resistance can be achieved whichever channel (p-channel or n-channel) is formed on the silicon layer 102. In other words, if a CMOS circuit is formed, the contact resistance reducing effect for both of the p-channel and n-channel type MOSFETs can be automatically obtained.

As described above, this embodiment does not require a lithography process over a Fin structure that rises high up and it can easily form different types of silicide layers separately on different surfaces as desired. Therefore, an ultrahigh-speed CMOS circuit not having a short channel effect but having a high mobility can be realized without an increase in the manufacture cost. Thus, the embodiment is very useful in practice.

Second Embodiment

Figure 5F:
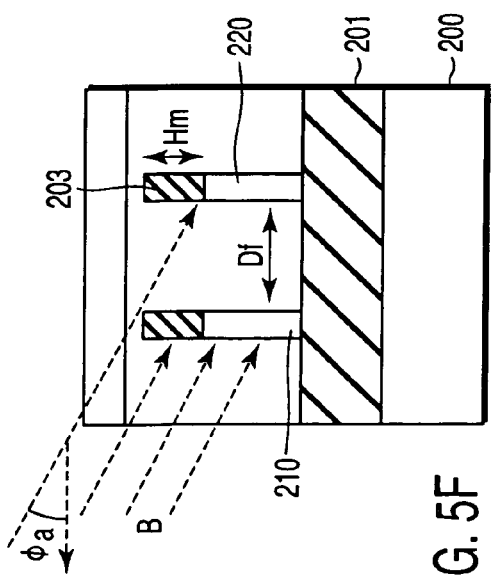
FIGS. 5A to 5P are cross sectional diagrams designed to illustrate processing steps of the manufacture of the Fin-MOSFET according to the second embodiment.
Figure 5G:
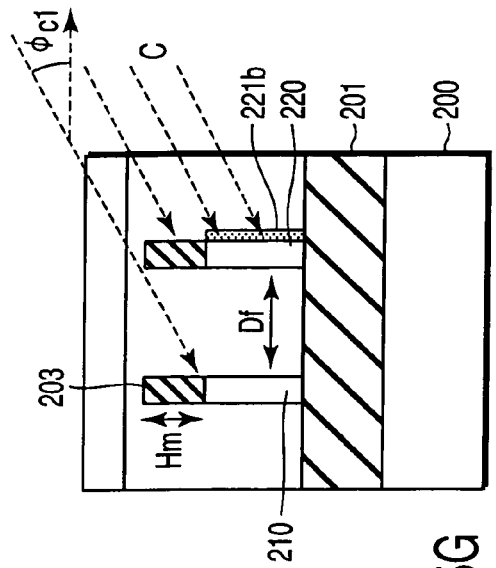
Figure 5H:
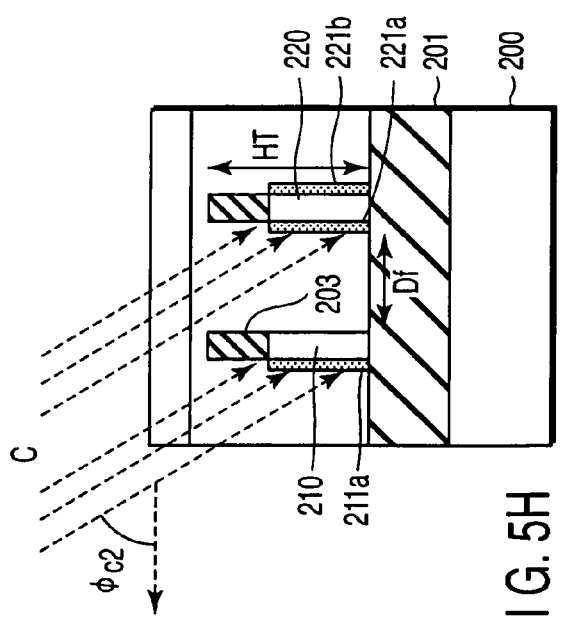
Figure 5I:
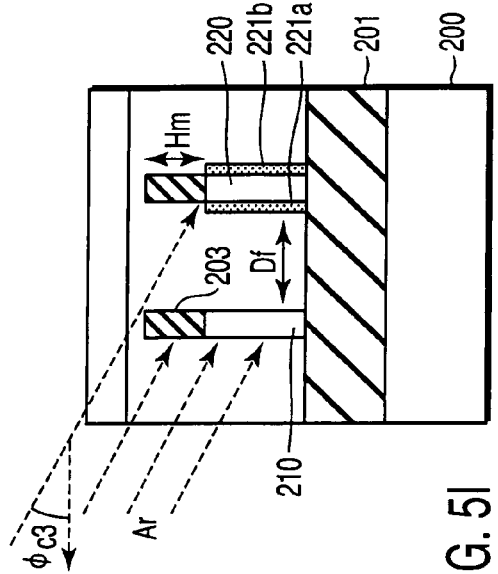
Figure 5J:
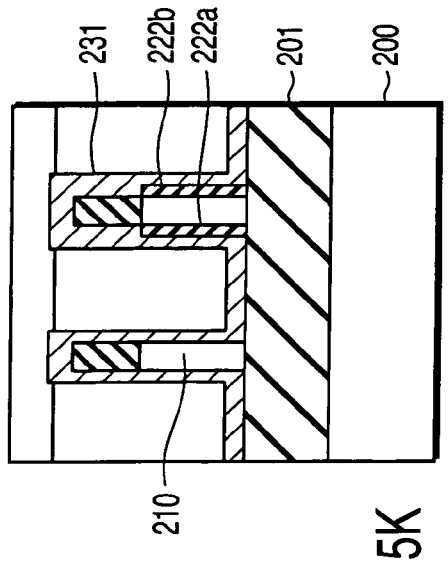
Figure 5K:
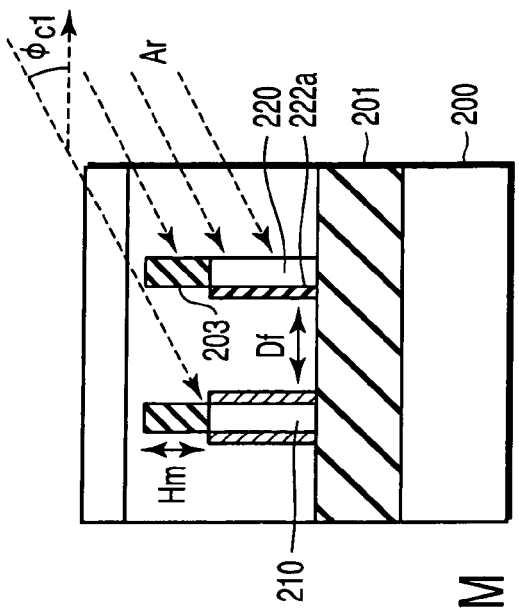
Figure 5L:
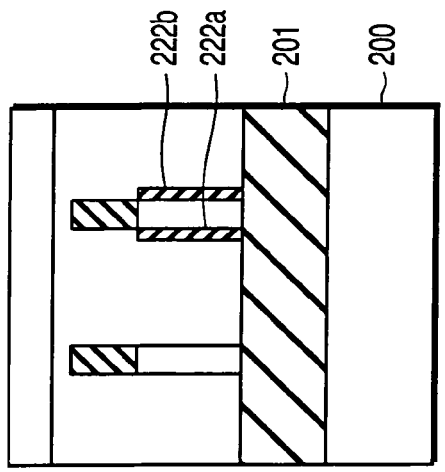
Figure 5M:
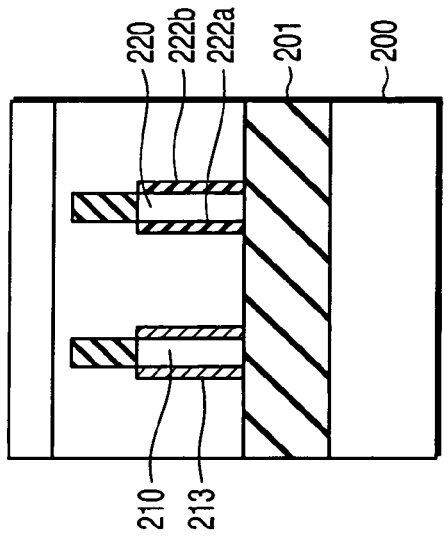
Figure 5N:
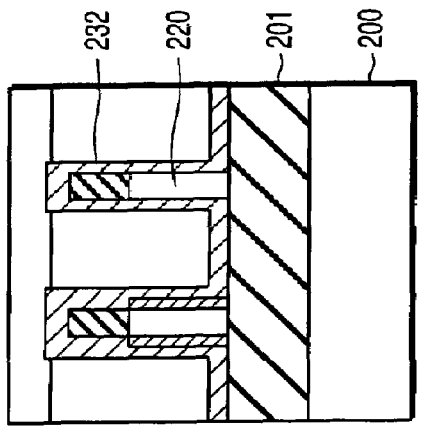
Figure 5O:
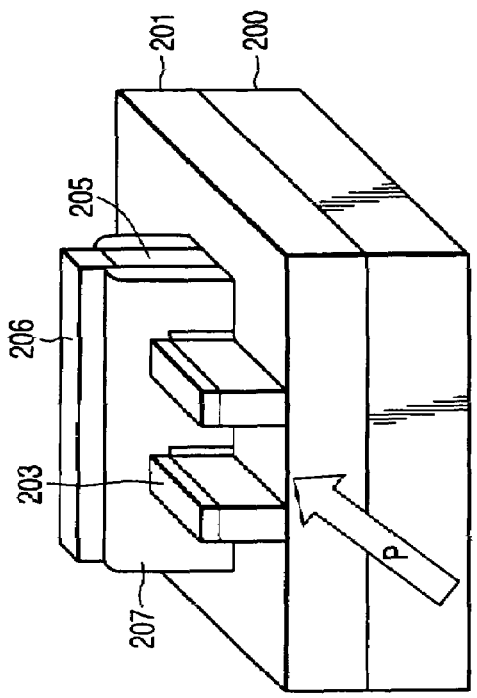
Figure 5P:
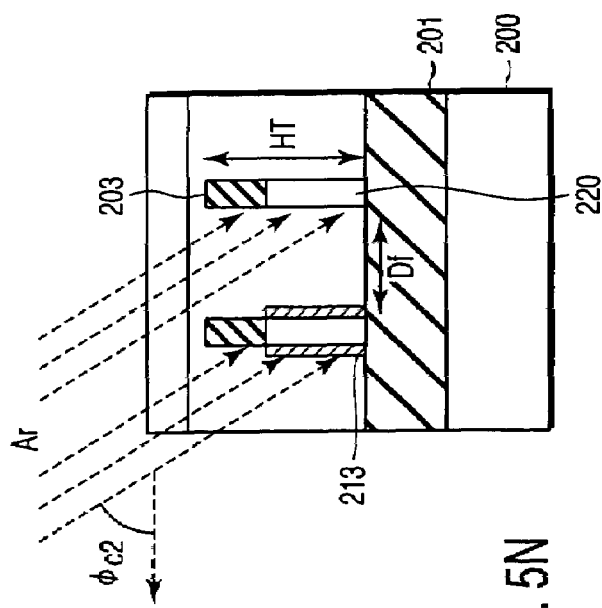

FIGS. 5A to 5P are simplified perspective diagrams showing steps of manufacturing a Fin-MOSFET, viewed from the longitudinal direction of the Fin-MOSFET, according to the second embodiment of the present invention. This embodiment realizes simple manufacturing of an ultrahigh speed complementary MOSFET (C-MOSFET) circuit with Fin structures having different silicide layers formed closely to each other on an SOI substrate.

FIG. 5A shows an SOI substrate including a silicon substrate 200, a silicon oxide film 201 and a monocrystalline silicon layer 202; a silicon nitride film 203, for example, formed on the SOI substrate by a CVD (chemical vapor composition) method or the like; and an etching mask, for example, a photoresist 209 formed further thereon by a conventional technique such as lithography.

From the above-described state, the silicon nitride film 203 and the monocrystalline silicon layer 202 are selectively etched with an RIE (reactive ion etching) method or the like, using the photoresist 209 as the etching mask, as shown in FIG. 5B. After that, the photoresist 209 serving as the etching mask is removed. Thus, vertical silicon walls (Fin) 210 and 220 are obtained.

Next, as shown in FIG. 5C, for example, a thermal oxide film 204 serving as a gate insulating film is formed to have a thickness of, for example, 2 nm on each of both side surfaces of Fins 210 and 220. Subsequently, a polysilicon film 205 and a silicon nitride film 206 are deposited by, for example, the CVD method. After that, the surface of the silicon nitride film 206 is planarized by a CMP (chemical mechanical polishing) method.

Next, an etching mask, which is not shown in the figure, is applied on the silicon nitride film 206 along the direction orthogonal to the longitudinal direction of the Fins 210 and 220. It should be noted that, because the polysilicon film 205 and silicon nitride film 206 have been planarized, the lithography process can be relatively easily carried out. Then using this mask, the polysilicon film 205 and silicon nitride film 206 are selectively etched by the RIE method. After the removal of the etching mask, a gate electrode made of the polysilicon film 205 is formed to straddle both Fins 210 and 220.

Of course, prior to the formation of the gate electrode, it is possible to introduce conductive impurities of opposite polarities to respective regions of the polysilicon film 205 adjacent to the Fin 210 and 2, using lithography and ion implantation.

Subsequently, for example, a silicon nitride film 207 is deposited conformally over the entire surface by, for example, the CVD method. After that, the silicon nitride film 207 is subjected to an isotropic etching such as the RIE method. Sufficient etching allows the silicon nitride film 207 to remain only on the sides of the gate electrode as a side wall insulating film, while the silicon nitride film 207 on the sides of the Fins 210 and 220 is completely removed during the etching. Further, the gate insulating film 204 exposed on the sides of the Fin 210 and 220 is removed with, for example, an HF solution.

Figure 6:
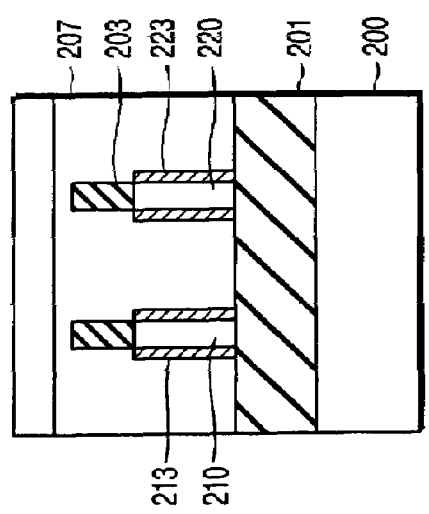
FIG. 6 is a perspective view showing the structure illustrated in FIG. 5D.

FIG. 5D shows a perspective view of the structure at this stage of manufacturing, projected along the channel direction of the Fin-MOSFET to be formed. For reference, FIG. 6 shows another perspective view of the structure at this stage together with the projecting direction P (indicated by an arrow), along which the illustration of FIG. 5D is obtained. From now on, it should be understood that, the projective, cross sectional, schematic views taken from the horizontal direction or upper vertical direction presented in the following descriptions of the embodiment are based on such an Fin-MOSFET structure.

Subsequently, as shown in FIG. 5E, a tilted ion implantation at a pre-determined angle allows selective introduction of conductive impurities, for example, n-type impurity such as As, only to the Fin 220. In the following description, to prevent misinterpretation and to simplify the illustration, the gate insulation film 204, that remains only underneath the gate electrode but is absent on the source and drain regions, will not be shown from this step on, because it is not directly connected to the processing steps from hereon.

The incident direction of As resides in a plane vertical to the direction P, and the angle of incident $\phi b$ (i.e., an angle formed between the incident direction and an horizontal direction within the vertical plane of the direction P) should satisfied the following relationship (A-1) defined below with respect to the thickness Hm of the silicon nitride film 203 and the internal distance Df between the Fins 210 and 220 as shown in FIG. 5E. It should be noted that [arctan] means [$\tan^{-1}$], which is an inverse function of [tan].

$$\phi b = <\arctan(Hm/Df) \quad \text{(A-1)}$$

Further, as shown in FIG. 5F, it is clear that conductive impurities, for example, p-type impurity B can be introduced only to the Fin 210 by a similar ion implantation but from the opposite side of the Fin-MOSFET with respect to the illustration of FIG. 5E. In this case, the incident direction is also located within a plane vertical to the direction P. Similarly, it suffices if the angle of incident $\phi a$ (i.e., an angle formed between the incident direction and another horizontal direction, opposite to the one used for the definition of $\phi b$, within the vertical plane of the direction P) satisfies the relationship (A-2) defined below with respect to the thickness Hm of the silicon nitride film 203 and the internal distance Df between the Fins 210 and 220 as shown in FIG. 5E.

$$\phi a < \arctan(Hm/Df) \quad \text{(A-2)}$$

In the above-described manner, it is possible to easily introduce conductive impurities of different polarities to respective Fins as desired, without lithography on steep topography. Therefore, the production cost for the CMOS circuit can be reduced.

Subsequently, these impurities can be thermally diffused into the thickness direction of each Fin and at the same time, activated, and thus the Fins 210 and 220 can form a p-MOSFET and n-MOSFET, respectively. Of course, impurities of different conductivities can be introduced to the Fins 210 and 220, separately, prior to the formation of the gate electrode at the stage shown in FIG. 5B by applying the method described here.

Next, in a similar manner to that shown in FIG. 5E, C atoms are implanted at an oblique angle as shown in FIG. 5G. The incident direction is located within a plane vertical to the direction P, and the angle of incident $\phi c1$ (as defined in a similar manner as $\phi b$) should satisfy the relationship (C-1) defined below with respect to the thickness Hm of the silicon nitride film 203 and the internal distance Df between the Fins 210 and 220 as shown in FIG. 5G.

$$\phi c1 < \arctan(Hm/Df) \quad \text{(C-1)}$$

When the acceleration energy of the implantation is controlled to no more than 1 kV, the implantation range of C atoms remains near the side surface of the Fin up to a several-nm depth. As a result, a thin carbon-containing silicon side surface 221b is formed. The carbon concentration in the carbon-containing silicon side surface 221b about 5 atomic % is enough for the following fabrication.

Further, as shown in FIG. 5H, C atoms are implanted from the opposite side of the Fin-MOSFET to that of FIG. 5G(g). The incident direction is located within a plane vertical to the direction P, and it suffices if the angle of incident $\phi c2$ (as defined in a similar manner as $\phi a$) satisfies the relationship (C-2) defined below with respect to the total of the thickness of the silicon nitride film 203 and the height of the Fins, that is, HT and the internal distance Df between the Fins 210 and 220 as shown in FIG. 5H.

$$\phi c2 > \arctan(HT/Df) \quad \text{(C-2)}$$

When the acceleration energy of the implantation is controlled to no more than 1 kV, the implantation range of C atoms remains near the side surface of the Fin up to a several-nm depth. As a result, carbon-containing silicon side surfaces 211a and 221a are formed. It suffices if the carbon content of the carbon-containing silicon side surfaces 211a and 221a is about 5 atomic %.

It should be noted that the above-described C atom implantation processes can be carried out consecutively in the same processing tool.

Next, in a similar manner to that shown in FIG. 5H, atoms having an etching capability, for example, when sputter-etching should be carried out, Ar atoms are implanted as shown in FIG. 5I. Here, in connection with the incident direction, it suffices if angle of incident $\phi c3$ (as defined in a similar manner as $\phi a$) satisfies the relationship (C-3) defined below with respect to the thickness Hm of the silicon nitride film 203 and the internal distance Df between the Fins 210 and 220 as shown in FIG. 5H.

$$c3 < \arctan(Hm/Df) \quad \text{(C-3)}$$

As a result, the carbon-containing silicon side surface 211a is removed, and only the carbon-containing silicon side surfaces 221a and 221b remain on both side surfaces of the Fin 220. In this manner, carbon-containing silicon layers are formed selectively only on both side surfaces of the Fin 220 without using a lithography process at all, which is remarkable.

After that, the structure is thermally oxidized and then treated with an HF solution. Thus, an HF-resisting oxide film 222 (222a and 222b) is formed only on both of the side surfaces of the Fin 220 as shown in the FIG. 5J. On the other hand, the silicon layers are exposed on both side surfaces of the Fin 210.

Subsequently, a Pt film 231 serving as the first silicide metal is deposited on the entire surface of the structure by an appropriate effective method of conventional techniques including a sputtering method. The thickness of the Pt film 231 is adjusted in accordance with the film thickness of the Fin 210 so that only a part of the film can be silicided by the silicidation. For simplicity, FIG. 5K shows a cross section of the source and drain portions of the deposited Pt film 231, together with its projective view of schematic structure superimposed thereon.

The structure is then annealed in, for example, a nitrogen atmosphere at a temperature of 500%, and thus the siliciding reaction is allowed to progress selectively in both side surface portions of the Fin 210 where silicon is exposed. Subsequently, unreacted Pt is removed by immersing the structure in aqua regia for a short period of time. Thus, as shown in FIG. 5L, a PtSi layer 213 serving as the first silicide layer is obtained only on the side portions of the Fin 210. On the other hand, on the side portions of the Fin 220, the HF-resisting oxide film 222 remains.

Next, sputtering etching using Ar atoms is carried out in such a manner that satisfies the conditions of the incident angle illustrated in FIG. 5G above. Thus, as shown in FIG. 5M, the HF-resisting oxide film 222b is removed and only the HF-resisting oxide film 222a remains.

Further, sputtering etching using Ar atoms is carried out in such a manner that satisfies the conditions of the incident angle illustrated in FIG. 5H above. Thus, as shown in FIG. 5N, the HF-resisting oxide film 222a is removed. Here, the PtSi layer 213 serving as the first silicide layer is exposed to Ar atoms. However, since the HF-resisting oxide film 222a is extremely thin as about 1 nm, the HF-resisting oxide film 222a can be selectively removed while maintaining the PtSi layer 213.

In this manner, silicon layers are exposed on both side surfaces of the Fin 220 without using a lithography process at all, which is remarkable.

Subsequently, for example, an Er film 232 serving as the second siliciding metal is deposited on the entire surface of the structure by a sputtering method. The thickness of the Er film 232 is adjusted in accordance with the film thickness of the Fin 210 so that only a part of the film can be silicided by the siliciding process. For simplicity, FIG. 5O shows a cross section of the source and drain portions of the deposited Er film 232, together with its projective view of schematic structure superimposed thereon.

The structure is then annealed in, for example, a nitrogen atmosphere at a temperature of 300° C., and thus the siliciding reaction is allowed to progress selectively on both side surfaces of the Fin 220 where silicon is exposed. Then, unreacted Er is removed by immersing it in a mixture solution of sulfuric acid and hydrogen peroxide for a short period of time. Thus, as shown in FIG. 5P, a ErSi layer 223 serving as the second silicide layer is formed only on both sides of the Fin 220. It should be noted that with this temperature, the obtained layer has a composition ratio of about $ErSi_{1.7}$ to be more exact, but for simplicity, it is expressed simply ErSi here.

On the other hand, on the side portions of the Fin 210, the PtSi layer 213 serving as the first silicide layer remains, and therefore the ErSi film 223 is not formed on these side portions. The PtSi film 213 is thermally stable and it does not change at all at 300° C. Therefore, this film functions as an excellent siliciding preventing film during the siliciding reaction, which is carried out at 300° C.

As described, according to this embodiment, it is possible to independently form the first silicide layer 213 and the second silicide layer 223 on both side surfaces of each of the Fins 210 and 220, without lithography on the Fin structure that rises straight up. Thus, the Fins 210 and 220 can form a p-MOSFET and n-MOSFET, respectively. With the use of a PtSi layer, which has a small $\phi p$ value, as the first silicide layer 213 and an ErSi layer, which has a small $\phi n$ value, as the second silicide layer 223, the contact resistance with respect to the silicide layer is remarkably reduced in each of the MOSFETs. Therefore, a high-mobility and ultrahigh speed CMOS circuit free from a short channel effect can be realized without increasing the production cost.

In other words, thin-wall-shaped monocrystalline semiconductor layers of p-channel and n-channel types are separately provided and metal-semiconductor compound layers of different compositions are independently formed on the semiconductor layers. Thus, it is possible to select a metal material suitable for the p-channel and another metal material suitable for the n-channel, respectively. Further, by utilizing the advantage of being able to form an oxide film selectively by tilted C implantation with an appropriate angle, different metal-semiconductor compound layers can be formed without requiring a lithography process. Therefore, the contact resistance can be reduced for the elements of both polarities even they are of the CMOS structure. Thus, the increase in the production cost is avoided while enjoying an increase in device operation speed, which is achieved by the Fin-MOSFET structure.

After the above-described steps, an insulating film having a low dielectric constant is deposited as an interlayer film by, for example, the CVD method, and then contact holes to the source and detain electrode portions are formed by, for example, the RIE method. Further, a wiring material such as Cu is deposited, and the material is formed into a required shape to form a wiring layer by the RIE or the like. The resultant structure is then subjected to a mounting step and the like by conventional techniques, and thus a semiconductor device is completed.

In this embodiment, polysilicon is used as the gate electrode; however, it is only natural that some other metallic material cam be used besides this. Alternatively, it is possible to remove necessary sections of the nitride film located on the polysilicon gate electrode, and silicide the section on the polysilicon gate electrode or the entire film. Further, this siliciding process can be carried out separately from or at the same time as that of the siliciding process of the source and drain regions. In addition, the present invention is also applicable to such a case where the source and drain regions are all silicided and the Schottky transistors of Fin structures having different polarities are formed on the same substrate.

Further, prior to the silicidation of the source and drain regions, it is possible to grow an additional silicon layer selectively on the source and drain regions so as to increase the thickness of the source and drain regions. Furthermore, it is also possible to apply the silicidation of the source and drain regions not only to the Fin structure, but also the MOSFET of the conventional planar structure at the same time.

Lastly, in this embodiment, Ar is used as etching particles; however, as an alternative, it is clearly possible to use such an element having chemical etching properties as F in the implantation at an oblique incident angle.

Third Embodiment

FIGS. 7A to 7I are cross sectional diagrams designed to illustrate processing steps of the manufacture of the Fin-MOSFET according to the third embodiment. This embodiment is a method of forming an ultrahigh-speed complementary MOSFET (C-MOSFET) of such a Fin structure that is formed on an SOI substrate and comprises a plurality of Fins with different Fin intervals and different silicide layers depending on the type of polarity.

Through similar processing steps for forming the structure shown in FIGS. 5D and 6, a Fin set 310 (Fins 311 to 314) that is required to form a p-MOSFET is prepared to have an internal interval Dfa between each adjacent pair of Fins, and another Fin set 320 (Fins 321 to 324) that is required to form an n-MOSFET is prepared to have an internal interval Dfb between each adjacent pairs of Fins. It should be noted that the figure illustrates a silicon substrate 300, a silicon oxide film 301 and a monocrystalline silicon layer (monocrystalline semiconductor layer) 302, which form an SOI substrate. FIGS. 7A to 7I are simplified projective views prepared in a similar manner to those from FIG. 5E on.

Further, here, there is a relationship of Dfa<Dfb, and it is assumed that the formula (A-3) (given later) can be established. After that, a silicon oxide film containing B (Boron), that is, for example, a BSG film, is deposited on the entire surface of the resultant structure, which is further subjected to a heat process. Thus, B is diffused into the Fins 310 and 320. After that, the BSG film is immersed into an HF solution, for example, to be removed.

Figure 7A:
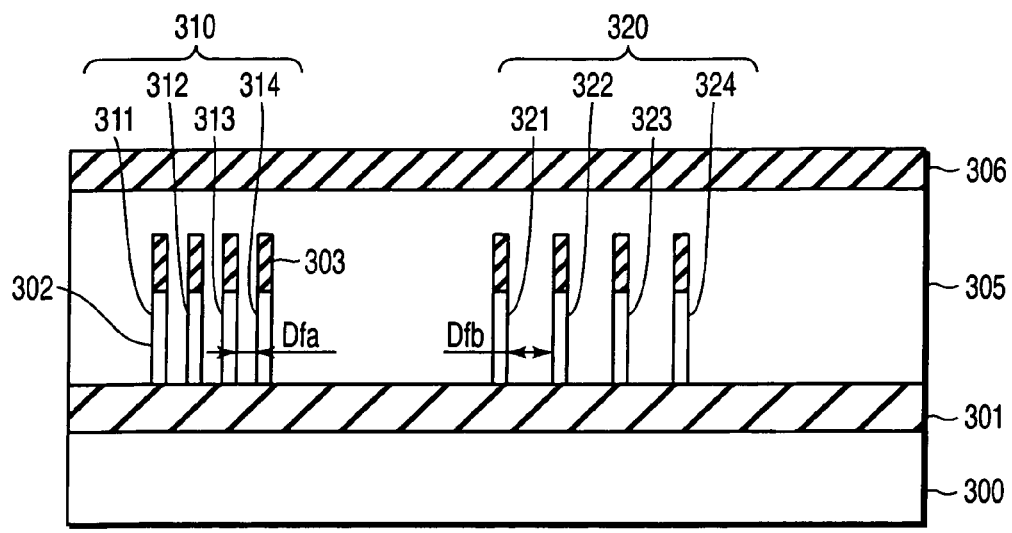
FIGS. 7A to 7I are cross sectional diagrams designed to illustrate processing steps of the manufacture of the Fin-MOSFET according to the third embodiment.
Figure 7B:
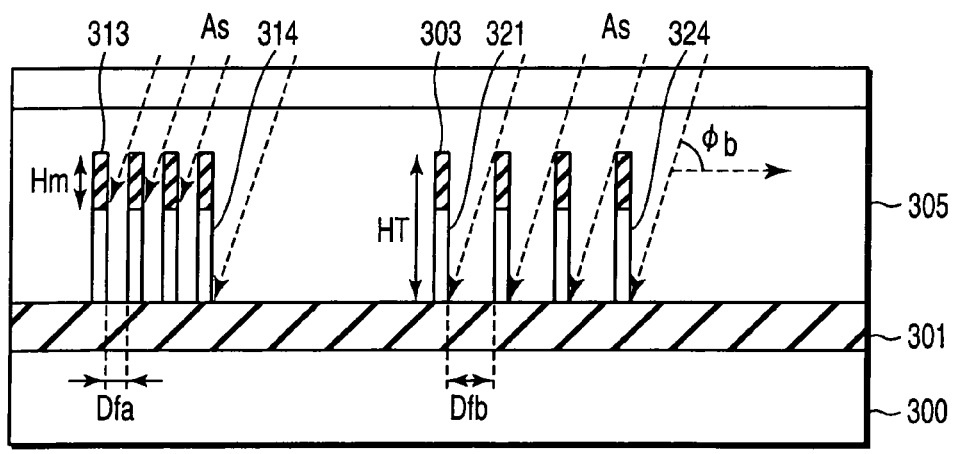

Next, as shown in FIG. 7B, with an oblique ion implantation, conductive impurities, for example, n-type impurity As are implanted only to the Fins 314 and 321 to 324. The incident direction is located within a plane vertical to the direction P (that is, the plane along the sheet of the figure). It suffices if the angle of incident db satisfies the relationship (A-3) defined below with respect to the thickness Hm of the silicon nitride film 303, the total of the thickness of the silicon nitride film 303 and the height of the Fins, that is, HT and the internal distances Dfa and Dfb between fins of the Fin sets, as shown in FIG. 7B. It should be noted that the amount of As implanted should be such that exceeds the amount of B incorporated and be able to render the polarity to an Fin to which As is implanted into the n-type.

$$\arctan(HT/Dfb) < \phi b = < \arctan(Hm/Dfa) \tag{A-3}$$

Subsequently, the resultant structure is annealed to diffuse these impurities evenly in the thickness direction of the Fin, and activate them at the same time, thus making the source and drain regions of Fins 311 to 313 the p-type polarity and source and drain regions of the Fins 314 and 321 to 324 the n-type polarity. As an alternative, it is possible that the above-described technique is applied before the formation of the gate electrode at the stage shown in FIG. 5B to implant impurities of different conductivities to the Fins in advance.

As described above, it is possible to easily introduce conductive impurities of different polarities to separate Fins, respectively as desired, without requiring a lithography Therefore, the production cost for the CMOS circuit can be reduced.

Figure 7C:
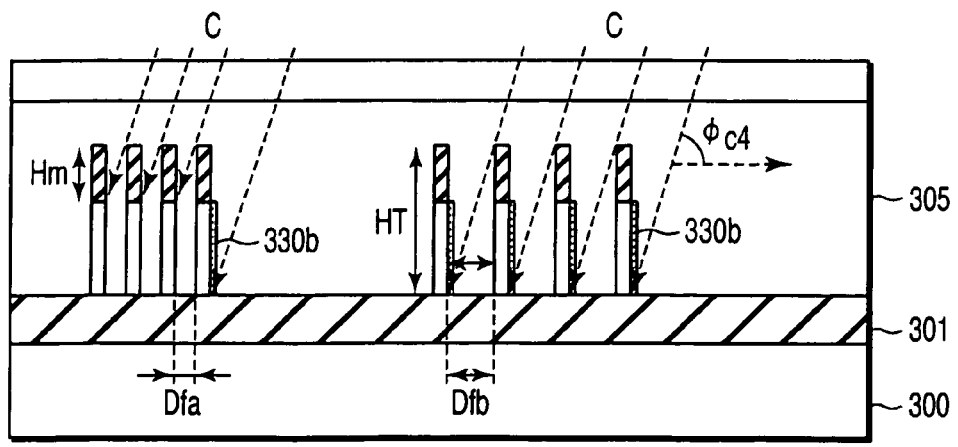

Next, in a similar manner to that shown in FIG. 7B, C atoms are implanted at an oblique angle as shown in FIG. 7C. The incident direction is located within a plane vertical to the direction P, and it suffices if the angle of incident $\phi c4$ (as defined in a similar manner as $\phi b$) satisfies the relationship (C-4) defined below with respect to the thickness Hm of the silicon nitride film 303, the total of the thickness of the silicon nitride film 303 and the height of the Fins, that is, HT and the internal distances Dfa and Dfb between fins of the Fin sets, as shown in FIG. 7C.

$$\arctan(HT/Dfb) < \phi c4 < \arctan(Hm/Dfa) \tag{C-4}$$

When the acceleration energy of the implantation is controlled to no more than 1 kV, the C atoms implanted are localized in a side surface portion of each Fin up to a several-nm depth. As a result, a thin carbon-containing silicon side surface 330b is formed on each Fin. It suffices if the carbon content of the carbon-containing silicon side surface 330b is about 5 atomic %.

Figure 7D:
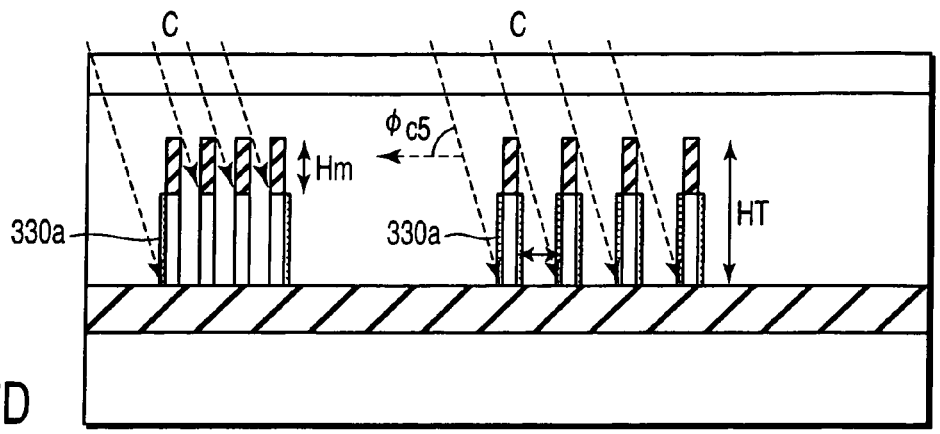
Figure 7E:
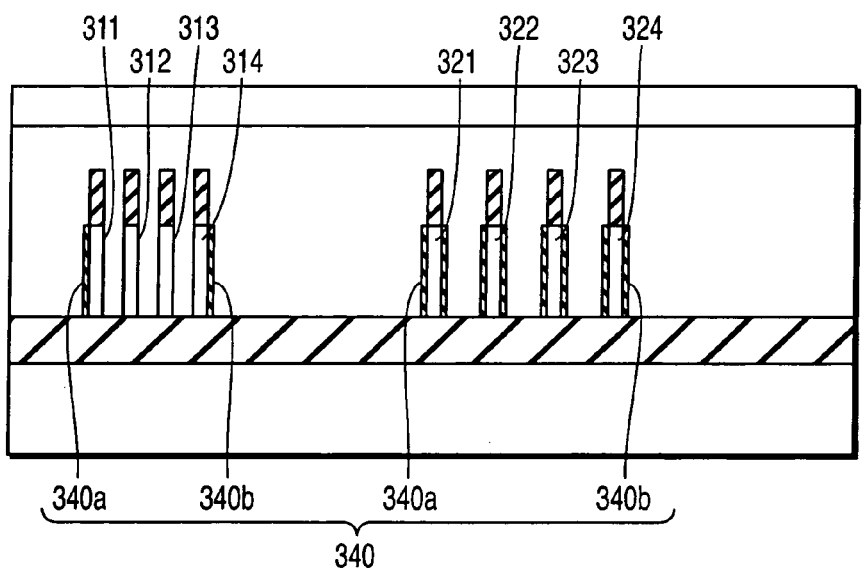

Further, as shown in FIG. 7D, C atoms are implanted from a direction symmetrical to that of FIG. 7D. The incident direction is located within a plane vertical to the direction P, and it suffices if the angle of incident φc5 (as defined in a similar manner as φa) satisfies the relationship (C-5) defined below as in the case of the relationship (C-4) above.

$$\arctan(HT/Dfb) < c5 < \arctan(Hm/Dfa) \quad (C-5)$$

When the acceleration energy of the implantation is controlled to no more than 1 kV, the C atoms implanted are localized in a side surface portion of each of the Fin up to a several-nm depth. As a result, a thin carbon-containing silicon side surface 330 is formed on each Fin. It suffices if the carbon content of the carbon-containing silicon side surface 330a in each Fin is about 5 atomic %. It should be noted that the above-described C atom implantation processes can be carried out consecutively in the same processing tool.

After that, the structure is annealed and then treated with an HF solution. Thus, an HF-resisting oxide film 340 is formed only on one side surface of each of the Fins 311 and 314, and on both side surfaces of each of Fins 321 to 324. On the other hand, the silicon layers are exposed on both side surfaces of each of the Fins 312 and 313.

Figure 7F:
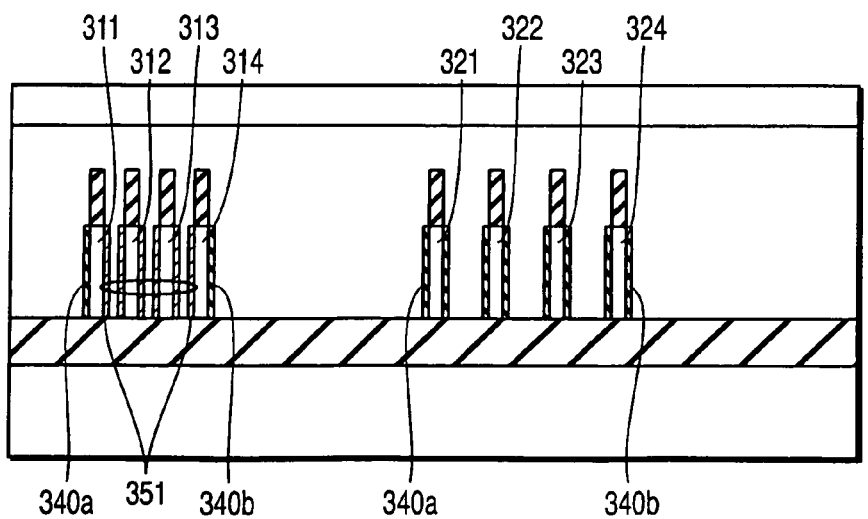

Subsequently, a Pt film of a desired thickness, which serves as the first silicidation metal is deposited on the entire surface of the structure by, for example, a sputtering method. The thickness of the Pt film is adjusted in accordance with the film thickness of the Fin 210 so that only a part of the film can be silicided by the siliciding process. The structure is then annealed in, for example, a nitrogen atmosphere at a temperature of 500° C., and thus the siliciding reaction is allowed to progress selectively on side surfaces of each respective Fin where silicon is exposed. Then, unreacted Pt is removed by immersing it in aqua regia for a short period of time to. Thus, as shown in FIG. 7F, a PtSi layer 351 serving as the first silicide layer is obtained only on one side surface of each of the Fins 311 and 314 and both side surfaces of each of the Fins 312 and 313. On the other hand, on the side portion of each of the Fins 321 to 324, the HF-resisting oxide film 340 remains.

Figure 7G:
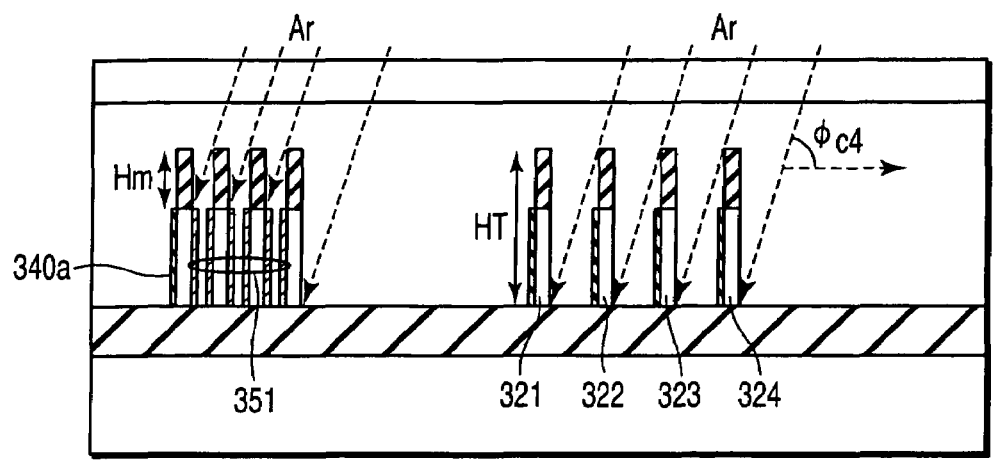
Figure 7H:
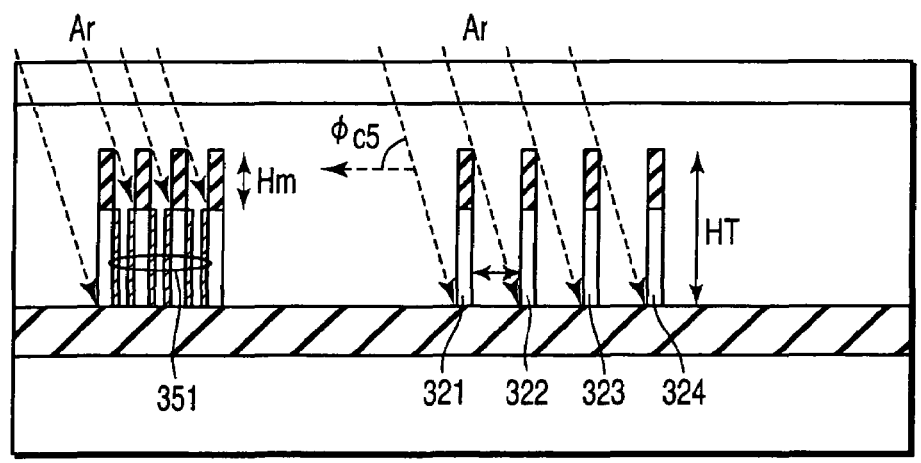

Next, as shown in FIGS. 7G and 7H, element having etching properties, for example, if sputtering etching is to be carried out, Ar atoms are implanted in such a manner that satisfies the conditions of the incident angle illustrated in FIGS. 7C and 7D above. Thus, the HF-resisting oxide film 340 is removed from each respective Fin. On the other hand, the PtSi layer 351 serving as the first silicide layer on each respective Fin is not exposed to Ar atoms.

In this manner, silicon layers are exposed from both side surfaces of each of the Fins 321 to 324 without using a lithography process at all.

Subsequently, for example, an Er film of a desired thickness, which serves as the second siliciding metal is deposited on the entire surface of the structure by, for example, a sputtering method. The thickness of the Er film is adjusted in accordance with the film thickness of the Fins so that only a part of each of the film can be silicided by the siliciding process. The structure is then annealed in, for example, a nitrogen atmosphere at a temperature of 300° C., and thus the siliciding reaction is allowed to progress selectively on side surfaces of each of the Fins 321 to 324 where silicon is exposed. Then, unreacted Er is removed by immersing it in a mixture solution of sulfuric acid and hydrogen peroxide for a short period of time.

Figure 7I:
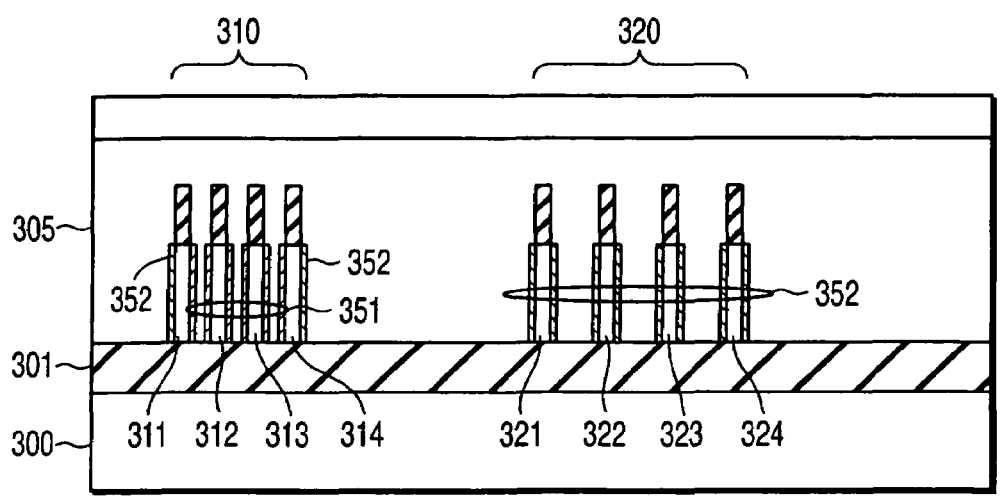

Thus, as shown in FIG. 7I, an ErSi layer 352 serving as the second silicide layer is formed only on both side portions of each of the Fins 321 to 324 and on one side portion (outer side) of each of the Fins 311 and 314. (It should be noted that with this temperature, the obtained layer has a composition ratio of about $ErSi_{1.7}$ to be more exact, but for simplicity, it is expressed simply ErSi here.) On the other hand, on the other side portion (inner side) of each of the Fins 311 and 314, and both sides of each of the Fins 312 and 313, the PtSi film 315 serving as the first silicide layer remains, and therefore the ErSi film is not formed on these side portions. The PtSi film is thermally stable and it does not change at all at 300° C. Therefore, this film functions as an excellent siliciding preventing film during the siliciding reaction, which is carried out at 300° C.

As described, it is possible to independently form the first silicide layer 315 and the second silicide layer 352 respectively on both side surfaces of each of the Fins 312 and 313 and both side surfaces of each of the Fins 321 and 324, without requiring a lithography process at all. Thus, the Fins 312 and 313 and the Fins 321 to 324 can form a p-MOSFET and n-MOSFET, respectively, to prepare a CMOS circuit. Note that the Fins 311 and 314 are dummies, which are not used.

With the use of a PtSi layer, which has a small φp value, as the first silicide layer 351 and an ErSi layer, which has a small φn value, as the second silicide layer 352, the contact resistance with respect to the silicide layer is remarkably reduced in each of the MOSFETs.

In this embodiment, the dummy Fins 311 and 314 (two is enough), and the same number of p-MOSFET-use Fins 312 and 313. However, it is only natural when using dummies that the number of p-MOSFET-use Fins is increased as needed to assure the driving power.

After the above-described steps, an insulating film having a low dielectric constant is deposited as an interlayer film by, for example, the CVD method, and then contact holes to the source and detain electrode portions are formed by, for example, the RIE method. Further, a wiring material such as Cu is deposited, and the material is formed into a required shape to form a wiring layer by the RIE or the like. The resultant structure is then subjected to a mounting step and the like by conventional techniques, and thus a semiconductor device is completed.

As described above, with use of a plurality of Fins formed at different intervals depending on the polarity of the MOSFET, it is possible to independently form different types of silicide layers on the side surfaces of MOSFET's of respective polarities as desired in an easy manner without requiring the lithography over steep topography made of the Fin structure. Therefore, a high-mobility and ultrahigh speed CMOS circuit free from a short channel effect can be realized without increasing the production cost.

In the present embodiment, the number of Fins is variable as needed. In addition, the intervals between adjacent pairs of Fins do not necessarily have to be constant. In other words, when Dfa is set to the maximum value of the intervals in the p-MOSFETs and Dfb is set to the minimum value of the intervals in the n-MOSFETs, the above-described technique is applicable in a similar manner. Further, as described in connection with the second embodiment, the material of the gate electrode, the method of siliciding the source and drain regions, the type of etching particles, and the like can be changed in various ways.

As described above, there are a plurality of Fins prepared in this embodiment to manufacture the CMOS circuit of the Fin-MOSFET structure.

At the same time, by setting the Fins at different intervals between the p-MOSFETs and n-MOSFETs and carrying out the oblique ion implantation, it is possible to introduce conductive impurities of different polarities to respective sets of Fins, constituting p-MOSFETs and n-MOSFETs independently, without requiring a lithography process usually carried out to the Fin structure that rises straight up. Thus, conductive impurities of different polarities can be easily introduced to separate Fins, respectively as desired, without requiring a lithography over the steep topography made of the Fin structure.

Further, by setting the Fins at different intervals between the p-MOSFETs and n-MOSFETs, carrying out the oblique carbon (C) atom implantation and applying the etching particles at an oblique incident angle, it is possible to form different types of silicide layers respectively in the p-MOSFETs and n-MOSFETs, without requiring a lithography over the steep topography made of the Fin structure. Therefore, a high-mobility and ultrahigh speed CMOS circuit free from short channel effect can be realized without increasing the production cost.

Especially, in this embodiment, different types of silicide layers with small φn and φp values are formed in the source and drain regions of the n-MOSFETs and p-MOSFETs, respectively. With this structure, a silicide layer with a small Schottky barrier value is always present in an element of either type of polarity, and therefore the reduction of the contact resistance of the CMOS circuit and the high-speed operation can be achieved.

Fourth Embodiment

FIGS. 8A to 8F are top view diagrams designed to illustrate processing steps of the manufacture of the Fin-MOSFET according to the fourth embodiment of the present invention. This embodiment is directed to a method of forming an ultrahigh speed complementary MOSFET (C-MOSFET) of a Fin structure formed on an SOI substrate, which includes different types of silicide layers formed on the source and drain regions of Fin-MOSFET's of different polarities, whose channel directions also differ depending on the polarities of the MOSFET's.

Figure 8A:
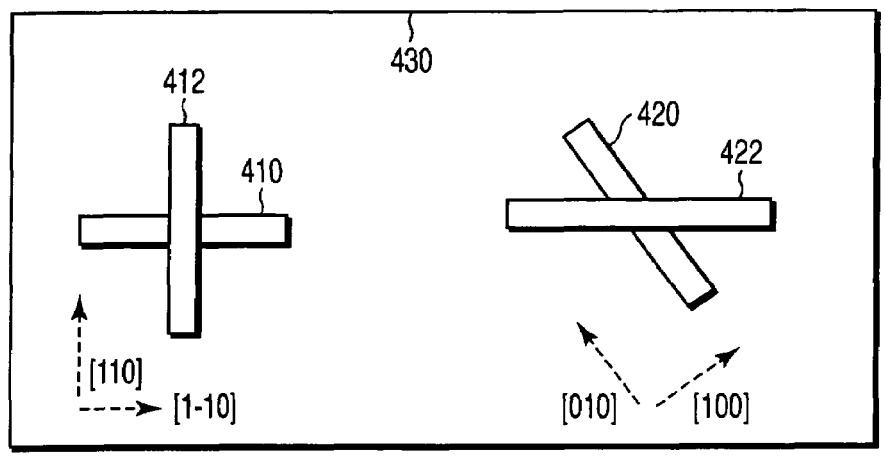
FIGS. 8A to 8F are top view diagrams designed to illustrate processing steps of the manufacture of the Fin-MOSFET according to the fourth embodiment.

First, through similar processing steps to those for forming the structure shown in FIG. 5D and FIG. 6 described above, a Fin-MOSFET structure is formed. Here, as shown in FIG. 8A, in which the structure is viewed from straight above, a Fin 410 which forms a p-MOSFET and a Fin 420 which forms an n-MOSFET are formed in the directions vertical to the crystal orientations [110] and [100], respectively. For simplification, FIG. 8A shows parts of a gate complex including a gate electrode, silicon nitride film (Cap) and gate side wall, denoted schematically by reference numerals 412 and 422. Further, a silicon oxide film formed on a silicon substrate is indicated symbolically as a frame 430.

It is known that holes, which contribute to the operation of the p-MOSFET, increase their mobility when they flow in the direction vertical to the direction of the crystal orientation [110] (i.e., (110) plane, in terms of crystallography). On the other hand, the n-MOSFET can exhibit the best properties when electrons are allowed to flow in the direction vertical to the direction of the crystal orientation [100] (i.e., (100) plane, in terms of crystallography). Therefore, as shown in FIG. 8A, by orienting the direction of the Fin differently between the p-MOSFET and n-MOSFET, it is possible to assure the highest driving power in each of the MOSFETS of the respective polarities, which is remarkable.

Figure 8B:
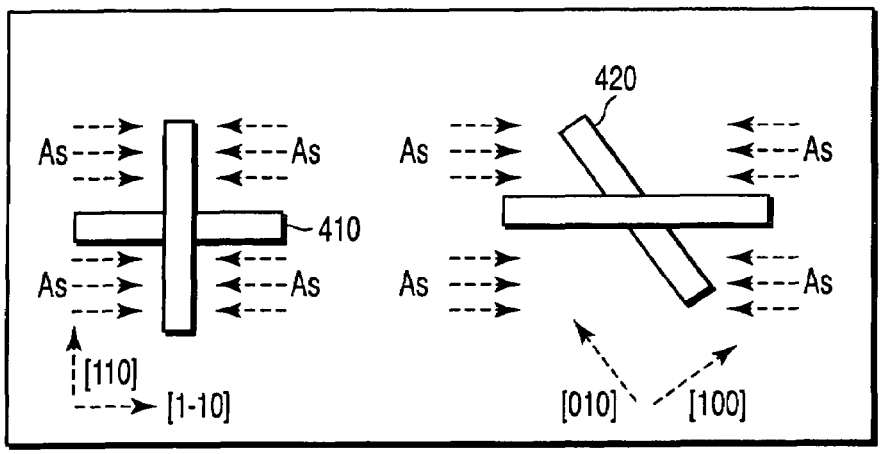

Next, a silicon oxide film containing B, that is, for example, a BSG film, is deposited on the entire surface of the resultant structure, which is further subjected to a heat process. Thus, B is diffused into the Fins 410 and 420. After that, the BSG film is immersed into an HF solution, for example, to be removed. Next, as shown in FIG. 8B, with an oblique ion implantation at an incident direction vertical to the crystal orientation [110], for example, n-type impurity As are implanted to the both ends of Fin 410 and the periphery of Fin 420. Subsequently, the resultant structure is subjected to a heat process to diffuse these impurities evenly in the thickness direction of the Fin (that is, the [100] direction), and activate them at the same time. It should be noted that the amount of As implanted should be such that exceeds the amount of B implanted and suffices to render the polarity to the Fin 420 into the n-type. On the other hand, the diffusion distance of As is about the same as the thickness of the Fin, and therefore the Fin 410 (to which As has been implanted only in its end portions), retains its p-type polarity near the gate structure 412.

As described above, it is possible to easily introduce conductive impurities of different polarities to separate Fins, respectively as desired, without requiring a lithography over the steep topography made of the Fin structures. Therefore, the production cost for the CMOS circuit can be reduced.

Figure 8C:
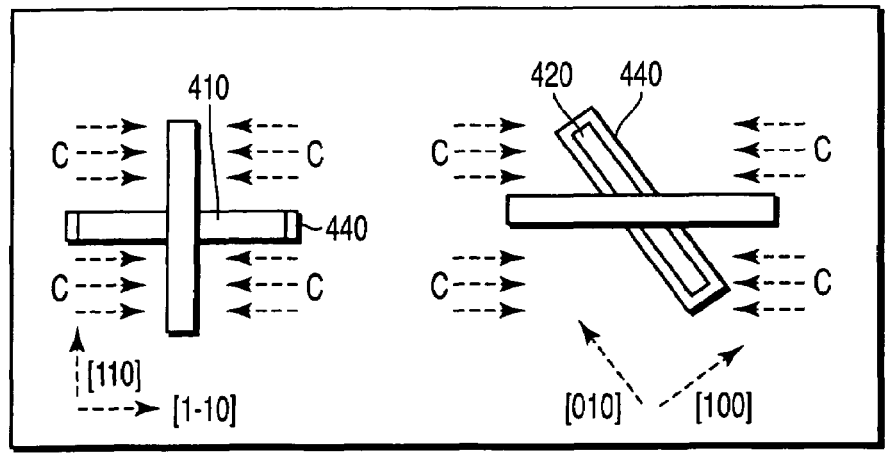

Next, in a similar manner to that shown in FIG. 8B, C atoms are implanted at such an oblique angle that the incident direction is vertical to the crystal orientation [110] as shown in FIG. 8C. When the acceleration energy of the implantation is controlled to no more than 1 kV, the C atoms implanted remain within a few nm from the implanted surface. As a result, a carbon-containing silicon side surface is formed on the both ends of Fin 410 and the periphery of Fin 420. After that, the resultant is subjected to a thermal oxidation process and treated with an HF solution, thereby forming an anti-HF oxide film 440 on the end portions of the Fin 410 and the periphery of the Fin 420.

Figure 8D:
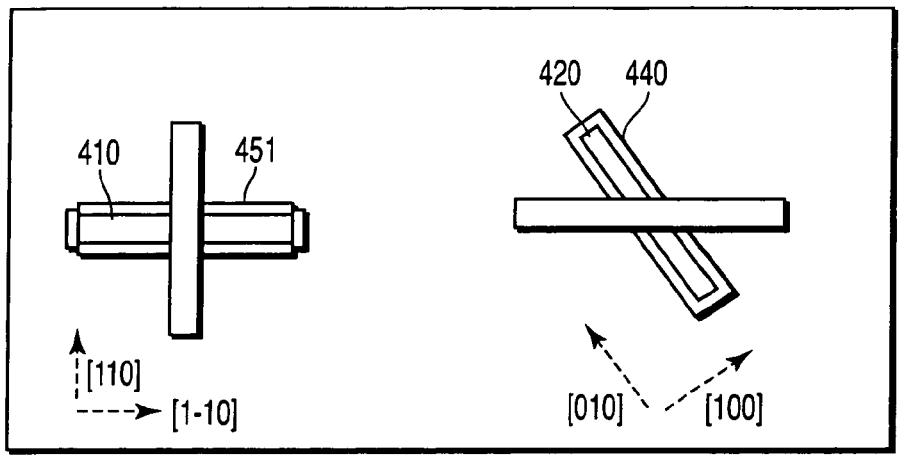

Subsequently, a Pt film of a desired thickness, which serves as the first siliciding metal is deposited on the entire surface of the structure by, for example, a sputtering method. The thickness of the Pt film is adjusted in accordance with the film thickness of the Fin so that only a part of the film can be silicided by the siliciding process. The structure is then annealed in, for example, a nitrogen atmosphere at a temperature of 500%, and thus the siliciding reaction is allowed to progress only in the side surface portions of the Fins where silicon is exposed. Then, unreacted Pt is immersed in aqua regia for a short period of time to selectively remove it. Thus, as shown in FIG. 8D, a PtSi layer 451 serving as the first silicide layer is obtained only on both side surfaces of the Fin 410 except for the end portions.

Figure 8E:
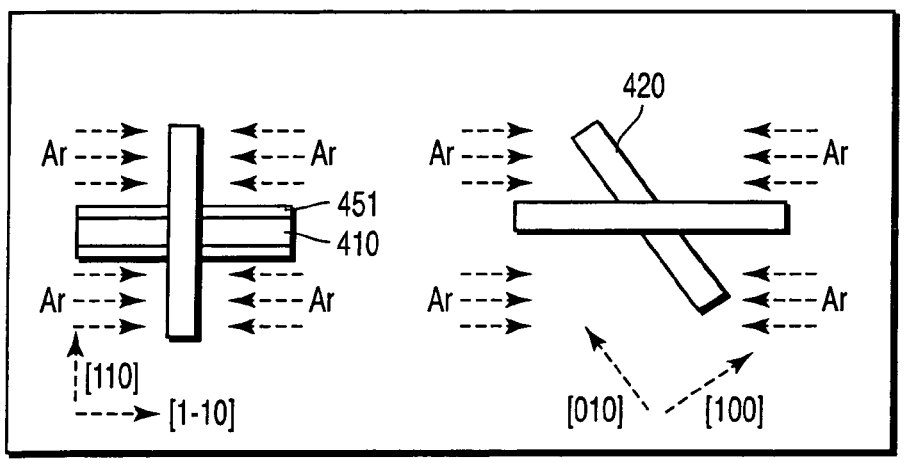

Next, as shown in FIG. 8E, element having etching properties, for example, if sputtering etching is to be carried out, Ar atoms are implanted at such an oblique angle that the incident direction is vertical to the crystal direction [110] as illustrated in FIG. 8C. Thus, the HF-resisting oxide film is removed from the respective Fin. On the other hand, the PtSi layer 415 serving as the first silicide layer on the Fin 410 is not exposed to the Ar atoms.

In this manner, silicon layers are exposed on the end portions of the Fin 410 and the periphery of the Fin 420 without using a lithography process at all.

Subsequently, for example, an Er film of a desired thickness, which serves as the second siliciding metal is deposited on the entire surface of the structure by, for example, a sputtering method. The thickness of the Er film is adjusted in accordance with the film thickness of the Fin so that only a part of each of the film can be silicided by the siliciding process. The structure is then annealed in, for example, a nitrogen atmosphere at a temperature of 300° C., and thus the siliciding reaction is allowed to progress only on the side surface portions of the Fins where silicon is exposed. Then, unreacted Er is immersed in a mixture solution of sulfuric acid and hydrogen peroxide for a short period of time to selectively remove it.

Figure 8F:
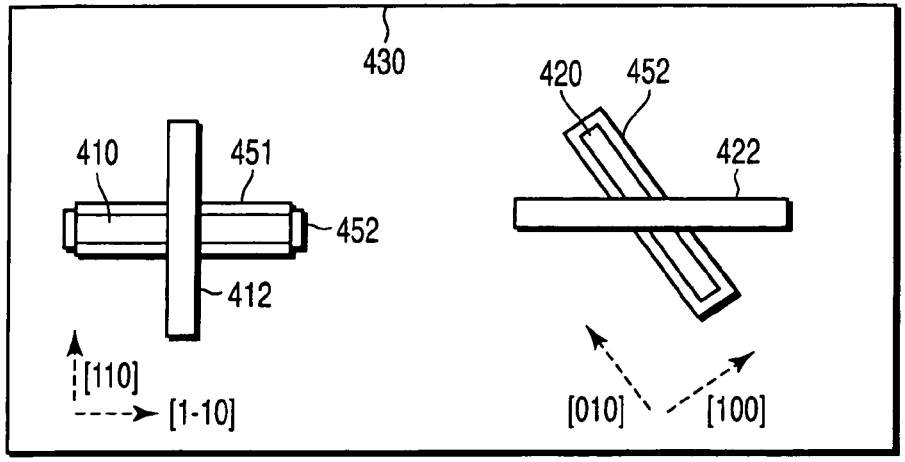

Thus, as shown in FIG. 8F, an ErSi layer 452 serving as the second silicide layer is formed only on the end portions of the Fin 410 and the periphery of the Fin 420. (It should be noted that with this temperature, the obtained layer has a composition ratio of about $ErSi_{1.7}$ to be more exact, but for simplicity, it is expressed simply ErSi here.) On the other hand, on both side portions of the Fin 410 except for the end portions, the PtSi film 451 serving as the first silicide layer remains, and therefore the ErSi film is not formed on these portions. The PtSi film is thermally stable and it does not change at all at 300° C. Therefore, this film functions as an excellent siliciding preventing film during the siliciding reaction, which is carried out at 300° C.

As described, it is possible to independently form the first silicide layer 451 and the second silicide layer 452 on both side surfaces of respective Fins 410 and 420, without requiring a lithography process at all. Thus, the Fins 410 and 420 can form a p-MOSFET and n-MOSFET, respectively. Therefore, with the use of a PtSi layer, which has a small φp value, as the first silicide layer 451 and an ErSi layer, which has a small φn value, as the second silicide layer 452, the contact resistance with respect to the silicide layer is remarkably reduced in each of the MOSFETs.

Further, because the orientations of the Fins are set differently between the p-MOSFET and n-MOSFET, to optimize their operation, the highest driving power can be achieved in the MOSFETs of both polarities.

After the above-described steps, an insulating film having a low dielectric constant is deposited as an interlayer film by, for example, the CVD method, and then contact holes to the source and detain electrode portions are formed by, for example, the RIE method. Further, a wiring material such as Cu is deposited, and the material is formed into a required shape to form a wiring layer by the RIE or the like. The resultant structure is then subjected to a mounting step and the like by conventional techniques, and thus a semiconductor device is completed.

As described above, by taking advantage of different Fin directions base on the polarities of the MOSFET's, it is possible to independently form different types of silicide layers on respective surfaces of MOSFET's of different polarities as desired in an easy manner without requiring the lithography process over the steep topography made of the fin structures. Therefore, a high-mobility and ultrahigh speed CMOS circuit free from a short channel effect can be realized without increasing the production cost.

In this embodiment, by rendering the interlayer insulating film to retain a certain internal stress and propagating the stress to the Fins, it is possible to modulate or increase the mobility of the Fin-MOSFET. Further, as in the case of the second embodiment, the material of the gate electrode, the method of siliciding the source and drain regions, the type of etching particles, and the like can be changed in various ways.

As described above, the orientation of the Fin is set differently between the p-MOSFET and n-MOSFET in this embodiment to manufacture the CMOS circuit of the Fin-MOSFET structure. By setting the different orientations of the Fins in the p-MOSFET and n-MOSFET, respectively, to select the most appropriate angle for each of the MOSFETs, it is possible to enhance the characteristics of the MOSFETs and to achieve the highest driving power in the MOSFETs of both polarities. At the same time, with the oblique ion implantation, it is possible to introduce conductive impurities of different polarities to respective Fins in the p-MOSFET and n-MOSFET, independently without requiring a lithography over the steep topography made of the fin structures. Therefore, similar effects to those described in connection with the third embodiment described above can be obtained.

(Modified Versions)

It should be noted that the present invention is not limited to those embodiments provided above. For example, each of the embodiments are described in connection with the case where silicon is used as the monocrystalline semiconductor layer, but it is alternatively possible to employ germanium (Ge) or some other semiconductor material in place of silicon. In such a case, the material bonded to the source and drain regions is not a silicide layer but a metal-semiconductor compound layer. Further, in the embodiments, the Pt-containing silicide layer is formed on the p-channel side, whereas the Er-containing silicide layer is formed on the n-channel side. However, as long as a metal has a sufficiently small. φp or φn value, it can be used as the siliciding metal in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a MOSFET-type semiconductor device, the method comprising:

forming a monocrystalline semiconductor layer in a shape of a wall on an insulating film;

forming a gate electrode to be straddling over the semiconductor layer via an insulating film;

forming source and drain regions on the semiconductor layer using the gate electrode as a mask;

implanting carbon (C) at an oblique angle to one of the side walls of each of the source and drain regions;

thermally oxidizing the side wall surfaces and then immersing them into an HF solution, to form a protective insulating film on the side wall surfaces to which C is applied;

forming a first metal-semiconductor compound layer on the side wall surface of each of the source and drain regions, to which C is not applied, while maintaining the insulating film on the side wall surfaces to which C is applied; and forming a second metal-semiconductor compound layer having a different composition and Schottky barrier height with respect to the semiconductor layer from those of the first metal-semiconductor compound layer on the side wall of each source and drain regions to which C is applied after removing the side wall protective insulating film.

2. The method according to claim 1, wherein the side wall protective insulating film is removed by applying ions thereto at an oblique angle.

3. A method of manufacturing a MOSFET-type semiconductor device, the method comprising:

forming first and second monocrystalline semiconductor layers in a shape of a wall on an insulating film, with the semiconductor layers being aligned to be parallel with each other;

forming a gate electrode to be straddling over each of the first and second monocrystalline semiconductor layers via an insulating film;

forming source and drain regions on each of the first and second monocrystalline semiconductor layers using the gate electrode as a mask;

implanting carbon (C) at an oblique angle to the both side walls of each of the source and drain regions of the second monocrystalline semiconductor layer;

thermally oxidizing the side wall surfaces of each of the first and second monocrystalline semiconductor layers and then immersing them into an HF solution, to form a protective insulating film on both side walls of each of the source and drain regions of the second monocrystalline semiconductor layer to which C is applied;

forming a first metal-semiconductor compound layer on both side walls of each of the source and drain regions of the first monocrystalline semiconductor layer to which C is not applied while maintaining the protective insulating film on both side walls of each of the source and drain regions of the second monocrystalline semiconductor layer to which C is applied; and forming a second metal-semiconductor compound layer having a different composition and Schottky barrier height with respect to the second semiconductor layer from those of the first metal-semiconductor compound layer on both side walls of each of the source and drain regions of the second monocrystalline semiconductor layer to which C is applied after removing the protective insulating film.

4. The method according to claim 3, wherein the first and second monocrystalline semiconductor layers are made of silicon materials of different conductivity types, respectively, the first and second metal-semiconductor compound layers are both made of silicide, and one of the first and second metal-semiconductor compound layers contains Pt, and the other one contains Er.

5. The method according to claim 3, further comprising, in order to introduce C to both side walls of each of the source and drain regions of the second monocrystalline semiconductor layer:

providing a cap layer having a predetermined height on each of the first and second monocrystalline semiconductor layers;

implanting C to one of the side walls of each of the source and drain regions of the second monocrystalline semiconductor layer, at a first angle tilted towards the opposite direction to the first monocrystalline semiconductor layer when it is viewed at a middle point between the first and second semiconductor layers, so that C is incorporated only on the second semiconductor layer's side walls at the opposite side of the first monocrystalline semiconductor layer, while the side walls of the first monocrystalline semiconductor layer are protected from the oblique C implantation using the second monocrystalline semiconductor layer and the cap layer thereon as implantation masks;

implanting C to the other side wall of each of the source and drain regions of the second monocrystalline semiconductor layer, at a second angle tilted towards the direction of the first monocrystalline semiconductor layer when it is viewed at a middle point between the first and second semiconductor layers, with the absolute value of the second angle with respect to the vertical direction of the substrate being smaller than that of the first angle, so that C is incorporated on the second semiconductor layer's side walls at the side of the first monocrystalline semiconductor layer together with the first semiconductor layer's side walls at the opposite side of the second monocrystalline semiconductor layer; and removing the C incorporated on the first semiconductor layer's side walls at the opposite side of the second monocrystalline semiconductor layer, by ion impingement applied at a third angle tilted towards the direction of the first monocrystalline semiconductor layer when it is viewed at a middle point between the first and second semiconductor layers, with the absolute value of the third angle with respect to the vertical direction of the substrate being larger than that of the second angle, so that the ions impinge only on the first semiconductor layer's side walls at the opposite side of the second monocrystalline semiconductor layer, while the side walls of the second monocrystalline semiconductor layer are protected from the oblique ion impingement using the first monocrystalline semiconductor layer and the cap layer thereon as implantation masks, thus removing the C only on the first semiconductor layer's side walls at the opposite side of the second monocrystalline semiconductor layer.

6. The method according to claim 5, wherein the cap layer is an insulating film used as a mask when processing the first and second monocrystalline semiconductor layers.

7. A method of manufacturing a MOSFET-type semiconductor device, the method comprising:

forming first monocrystalline semiconductor layers in a shape of a wall on an insulating film, the first monocrystalline semiconductor layers being aligned in parallel with each other at intervals of a first distance;

forming second monocrystalline semiconductor layers in a shape of a wall on the insulating film, the second monocrystalline semiconductor layers being aligned in parallel with each other at intervals of a second distance which is longer than the first distance, and in parallel with the first monocrystalline semiconductor layers;

forming gate electrodes to be straddling over on each of side wall surfaces of each of the first and second monocrystalline semiconductor layers via an insulator film;

forming source and drain regions on each of the first and second monocrystalline semiconductor layers using the gate electrodes as masks;

implanting carbon (C), to both side walls of each of the source and drain regions of each of the second monocrystalline semiconductor layers by applying C thereto at an oblique angle;

thermally oxidizing the side walls of each of the source and drain regions of each of the first and second monocrystalline semiconductor layers and then immersing them into an HF solution, to form a protective insulating film on both side walls of each of the source and drain regions of each of the second monocrystalline semiconductor layers to which C is applied;

forming first metal-semiconductor compound layers on both side walls of each of the source and drain regions of each of the first monocrystalline semiconductor layers to which C is not applied while maintaining the protective insulating film on both side walls of each of the source and drain regions of each of the second monocrystalline semiconductor layer to which C is applied; and forming second metal-semiconductor compound layers having a different composition and Schottky barrier height with respect to the second semiconductor layers from those of the first metal-semiconductor compound layers on both side walls of each of the source and drain regions of each of the second monocrystalline semiconductor layers to which C is applied after removing the protective insulating film.

8. The method according to claim 7, further comprising, in order to introduce C to both side walls of each of the source and drain regions of each of the second monocrystalline semiconductor layers:

providing a cap layer having a predetermined height for each of the first and second monocrystalline semiconductor layers; and setting an angle of oblique incident of C such that C does not reach the side wall surfaces of the first monocrystalline semiconductor layers aligned at the first interval but C reaches the side wall surfaces of the second monocrystalline semiconductor layers aligned at the second interval.

9. The method according to claim 8, wherein the cap layer is formed of an insulating film used as a mask when processing the first and second monocrystalline semiconductor layers.

10. The method according to claim 7, wherein the first and second monocrystalline semiconductor layers are made of silicon materials of different conductivity types, respectively, the first and second metal-semiconductor compound layers are both made of silicide, and each of one group of the first metal-semiconductor compound layers or the second metal-semiconductor compound layers contains Pt, and each of the remaining metal-semiconductor compound layers contains Er.

11. The method according to claim 10, further comprising:
providing a cap layer having a predetermined height for each of the first and second monocrystalline semiconductor layers; and
setting an angle of oblique incident of impurity ion such that impurity ion does not reach the side wall surfaces of the first monocrystalline semiconductor layers aligned at the first interval but the impurity ion reaches the side wall surfaces of the second monocrystalline semiconductor layers aligned at the second interval, thereby implanting the impurity selectively only to the second monocrystalline semiconductor layers by the oblique incident of impurity ion.

12. A method of manufacturing a MOSFET-type semiconductor device, the method comprising:
forming first monocrystalline semiconductor layer in a shape of a thin wall on an insulating film;
forming a second monocrystalline semiconductor layer in a shape of a thin wall on an insulating film with its longitudinal direction being oriented along a direction different from that of the first monocrystalline semiconductor layer;
forming gate electrodes to be straddling over the first and second monocrystalline semiconductor layers via an insulating film;
forming source and drain regions on each of the first and second monocrystalline semiconductor layers using the gate electrodes as masks;
applying carbon (C) in a direction parallel to the side wall surfaces of the first monocrystalline semiconductor layer, to implant C to both side walls of each source and drain regions of the second monocrystalline semiconductor layer without implanting it to both side walls of each source and drain regions of the first monocrystalline semiconductor layer;
thermally oxidizing the side wall surfaces of each of the source and drain regions of each of the first and second monocrystalline semiconductor layers and then immersing them into an HF solution, to form a protective insulating film on both side walls of each of the source and drain regions of the second monocrystalline semiconductor layer to which C is applied;
forming a first metal-semiconductor compound layer on both side walls of each of the source and drain regions of the first monocrystalline semiconductor layer to which C is not applied while maintaining the protective insulating film on both side walls of each of the source and drain regions of the second monocrystalline semiconductor layer to which C is applied; and
forming a second metal-semiconductor compound layer having a different composition and Schottky barrier height with respect to the second semiconductor layer from those of the first metal-semiconductor compound layer on both side walls of each of the source and drain regions of the second monocrystalline semiconductor layer to which C is applied after removing the protective insulating film.

13. The method according to claim 12, further comprising, in order to form the first and second monocrystalline semiconductor layers:
forming an n-type first monocrystalline silicon layer such that the side wall surfaces thereof are oriented vertical to a [110] direction or a crystal orientation equivalent thereto, and
forming a p-type second monocrystalline silicon layer such that the side wall surfaces thereof are oriented vertical to a [100] direction or a crystal orientation equivalent thereto.

14. The method according to claim 13, wherein the first metal-semiconductor compound layer is a silicide that contains Pt, and the second metal-semiconductor compound layer is a silicide that contains Er.

* * * * *

UNITED STATES PATENT AND TRADEMARK OFFICE
CERTIFICATE OF CORRECTION

| | |
|---|---|
| PATENT NO. | : 7,678,652 B2 |
| APPLICATION NO. | : 12/222146 |
| DATED | : March 16, 2010 |
| INVENTOR(S) | : Tsuchiaki |

Page 1 of 1

It is certified that error appears in the above-identified patent and that said Letters Patent is hereby corrected as shown below:

On the Title page, Item (57), in the Abstract, line 3, change "a insulating" to --an insulating--.

Claim 12, column 21, line 30, change "forming first" to --forming a first--.

Signed and Sealed this

Fifteenth Day of June, 2010

David J. Kappos
*Director of the United States Patent and Trademark Office*